United States Patent
Izumi et al.

(10) Patent No.: US 6,480,577 B1
(45) Date of Patent: Nov. 12, 2002

(54) ACTIVE MATRIX SUBSTRATE, METHOD OF MANUFACTURING SAME, AND FLAT-PANEL IMAGE SENSOR

(75) Inventors: Yoshihiro Izumi, Kashihara; Hisashi Nagata, Nara; Yuichi Saito, Tenri, all of (JP)

(73) Assignee: Sharp Kabushiki Kaisha, Osaka (JP)

( * ) Notice: Subject to any disclaimer, the term of this patent is extended or adjusted under 35 U.S.C. 154(b) by 0 days.

(21) Appl. No.: 09/542,485

(22) Filed: Apr. 3, 2000

(30) Foreign Application Priority Data

Apr. 7, 1999 (JP) .......................................... 11-100511
Dec. 24, 1999 (JP) .......................................... 11-368301

(51) Int. Cl.⁷ ............................................... G09G 3/36
(52) U.S. Cl. .............................. 379/40; 349/42; 349/43; 257/546
(58) Field of Search ............................. 347/97, 90, 92, 347/40; 349/41, 42, 43, 44, 45, 46, 47; 361/111; 257/356, 546

(56) References Cited

U.S. PATENT DOCUMENTS

| | | | |
|---|---|---|---|
| 5,182,620 A | | 1/1993 | Shimada et al. |
| 5,379,336 A | | 1/1995 | Kramer et al. |
| 5,657,139 A | * | 8/1997 | Hayashi et al. ............... 349/40 |
| 5,953,084 A | | 9/1999 | Shimada et al. |
| 6,072,454 A | * | 6/2000 | Nakai et al. .................. 345/97 |

FOREIGN PATENT DOCUMENTS

| | | |
|---|---|---|
| EP | 0 523 783 A | 1/1993 |
| EP | 0 602 475 A | 6/1994 |
| EP | 0 783 177 A | 7/1997 |
| JP | 172685/1983 | 10/1983 |
| JP | 160173/1985 | 8/1985 |
| JP | 212458/1992 | 8/1992 |
| JP | 6-342098 | 12/1994 |

OTHER PUBLICATIONS

"A new digital detector for projection radiography," (Denny L. Lee, et al., Proc. SPIE vol. 2432, pp. 237–249, Medical Imaging 1995, May 1995).
"Application of a Si Active–Matrix technology in a X–ray detector Panel," (L.S. Jeromin, et al., SID 97 Digest, May 1997, pp. 91–94).
"A New Digital Detector for Projection Radiography", Lee et al, 1995, SPIE, vol. 2432, pp. 237–249.
U.S. patent application Ser. No. 09/239,855, filed Jan. 29, 1999, Teranuma et al.
U.S. patent application Ser. No. 09/229,269, filed Jan. 13, 1999, Izumi et al.
U.S. patent application Ser. No. 09/520,609, filed Mar. 7, 2000, Nagata et al.

* cited by examiner

Primary Examiner—Olik Chaudhuri
Assistant Examiner—Laura Schillinger
(74) Attorney, Agent, or Firm—Nixon & Vanderhye PC

(57) ABSTRACT

In an active matrix substrate, a glass substrate is provided with TFTs having gate electrodes connected to scanning lines also provided on the glass substrate. The glass substrate is further provided with auxiliary capacitance lines, formed on the same layer as the scanning lines. Further, pixel electrodes connected to drain electrodes of the TFTs are formed on the same layer as signal lines connected to source electrodes of the TFTs. An insulating layer is provided between the layer forming the signal lines and pixel electrodes and the layer forming the drain and source electrodes. Since the insulating film is present between the signal lines and the scanning and auxiliary capacitance lines, influence on the auxiliary capacitance value can be reduced, as can a signal line capacitance value. As a result, even when the auxiliary capacitance value is increased, the signal line capacitance value remains small.

24 Claims, 22 Drawing Sheets

ACTIVE MATRIX SUBSTRATE, METHOD OF MANUFACTURING SAME, AND FLAT-PANEL IMAGE SENSOR

FIELD OF THE INVENTION

The present invention relates to an image display device such as a liquid crystal display device, to an image capture device such as a flat-panel image sensor, and to an active matrix substrate used in the foregoing devices and a method of manufacturing such an active matrix substrate.

BACKGROUND OF THE INVENTION

Making the most of their superior characteristics including having a large surface area, and being thin and light weight, active matrix substrates can be used not only in image display devices such as liquid crystal display devices, but also in image capture devices such as flat-panel X-ray image sensors.

The following will explain the structure of a conventional active matrix substrate with reference to FIGS. 6 through 8. FIG. 6 is a plan view of a conventional active matrix substrate, showing one of a plurality of pixels provided in the active matrix substrate. Such an active matrix substrate is used to improve aperture ratio in the liquid crystal display devices such as those disclosed in Japanese Unexamined Patent Publication No. 58-172685/1983 (Tokukaisho 58-172685, published on Oct. 11, 1983) and U.S. Pat. No. 5,953,084 (issued on Sep. 14, 1999), and is structured as follows.

A plurality of scanning lines 52 and signal lines 56 are arranged in a lattice form on a glass substrate 51 (see FIGS. 7 and 8), and a switching element and a pixel electrode 57 are provided for each area where a scanning line 52 and a signal line 56 cross. Each of the switching elements is a thin-film transistor (hereinafter referred to as "TFT") 60, in which a gate electrode 55 is connected to the signal line 52, a source electrode 61 is connected to the signal electrode 56, and a drain electrode 63 is connected to the pixel electrode 57 via a drain line 63a and a contact hole 57a. Further, below the contact hole 57a is provided an auxiliary capacitance line 53.

FIGS. 7 and 8 are cross-sectional views of the foregoing conventional active matrix substrate, taken at lines D—D and E—E, respectively, of FIG. 6. On the insulative glass substrate 51 are provided the scanning line 52 (see FIG. 6), the gate electrode 55, which is a branch line of the scanning line 52, and the auxiliary capacitance line 53. On the surfaces of these elements oxidation films 52a and 53a (anodic oxidation (AO) films) are provided by anodic oxidation. Then a gate insulating film 54 is provided on the oxidation films 52a and 53a on the scanning line 52 and the auxiliary capacitance line 53, and on areas of the glass substrate 51 where the scanning line 52 and the auxiliary capacitance line 53 are not provided.

Then, on areas of the gate insulating film 54 lying above the gate electrode 55, a TFT 60, which is a switching element made up of a semiconductor domain 64 and a contact layer 65, is provided for each pixel. The source electrode 61 of the TFT 60 is connected to the signal line 56, which is provided on the gate insulating film 54 extending in a direction perpendicular to a direction in which the scanning line 52 extends. Further, the drain electrode 63 of the TFT 60 is connected to the drain line 63a provided on the gate insulating film 54.

Over the foregoing elements is provided a protective film 58 which covers the TFT 60 (including the source and drain electrodes 61 and 63), the signal line 56, the drain line 63a, and the gate insulating film 54. Then an inter-layer insulating film 59 and the pixel electrode 57 are provided over the foregoing elements. The pixel electrode 57 is electrically connected to the drain line 63a via a contact hole 57a which penetrates the inter-layer insulating film 59 and the protective layer 58. Further, the drain line 63a lies opposite the auxiliary capacitance line 53, but separated therefrom by the gate insulating film 54 and the oxidation film 53a, thus forming an auxiliary capacitance 62.

The following will explain a flat-panel X-ray image sensor and a liquid crystal display device which use the foregoing active matrix substrate.

In a flat-panel X-ray image sensor, a device intended to replace X-ray photograph devices which use conventional photosensitive photographic film, an image is formed based on a two-dimensional distribution of X-ray quantities incident on a flat panel of the image sensor. When using such a device, an X-ray source is provided separately, and an object to be photographed is placed between the X-ray source and the image sensor.

When an active matrix substrate is used in such a flat-panel X-ray image sensor, as disclosed in Japanese Unexamined Patent Publication No. 4-212458/1992 (Tokukaihei 4-212458, published on Aug. 4, 1992), a photoelectric conversion layer, for converting X-rays to electrical charges, is provided on the pixel electrodes 57, and the pixel electrodes 57 are used as charge-collecting electrodes. The photoelectric conversion layer is made of a semiconductor element, and this semiconductor element is provided by film formation directly on the pixel electrode 57, or by laminating thereon a semiconductor element formed separately.

The foregoing flat-panel X-ray image sensor provided with an active matrix substrate operates as follows. A DC current is applied between the pixel electrode 57 and a counter electrode provided above the photoelectric conversion layer. The TFT 60 is OFF except when reading an image, and a charge produced in the photoelectric conversion layer by X-rays incident thereon is collected in the auxiliary capacitance 62 via the pixel electrode 57. Reading of this charge is performed by selecting the corresponding pixel using the scanning line 52, and allowing the charge accumulated in the auxiliary capacitance 62 to flow to the signal line 56 via the TFT 60. Charges read out are amplified by a circuit, such as an operational amplifier, connected to the end of the signal line 56. Then an image is formed based on the distribution of charge quantities read out from all of the pixels.

When, on the other hand, the foregoing active matrix substrate is used in a liquid crystal display device, a counter electrode is provided opposite the pixel electrodes 57, with a liquid crystal layer therebetween. Then, by applying a potential difference between a pixel electrode 57 and the counter electrode, light passing through the liquid crystal layer is subject to a rotation of its plane of polarization corresponding to the potential difference. The direction of the plane of polarization of the light determines a quantity of light passing through a polarizing plate provided externally, thus forming an image by the intensity of light in each pixel.

In the active matrix substrate in this case, in a pixel selected by the scanning line 56, a potential is written to the pixel electrode 57 from the signal line 56 via the TFT 60. This produces the foregoing voltage between the pixel electrode 57 and the counter electrode.

Electrostatic capacitance parasitic in the lines provided in the active matrix substrate greatly influences the performance of the active matrix substrate. This electrostatic capacitance not only causes delay in transmission of signals inputted to the ends of these lines and of data from the pixels, but also causes the potential of non-target pixels and lines to fluctuate, and makes the potential of target lines susceptible to external influence. A further problem with this electrostatic capacitance is that it impairs the quality of images captured or displayed by the device incorporating the active matrix substrate.

In a flat-panel X-ray image sensor, image data is formed on the basis of charges accumulated in the pixel electrodes 57, read out through the signal lines 56. For this reason, electrostatic capacitance (signal line capacitance) between the signal lines 56 and the scanning lines 56 and auxiliary capacitance lines 53 increases the time necessary to read out the charges, and increases the noise component of the charges read out. As a result, quality of the captured image is impaired.

Particularly in a flat-panel X-ray image sensor, which forms an image from weak X-rays, it is necessary to read charges of small quantity accumulated in the pixel electrodes 57, and the influence of the foregoing electrostatic capacitance is especially serious.

However, in the conventional art, in which the signal lines 56 are provided on the gate insulating film 54, structurally, the interval between the signal lines 56 and the scanning lines 52 and that between the signal lines 56 and the auxiliary capacitance lines 53 tend to become too small. This tends to increase the signal line capacitance value, which is likely to impair the quality of the captured image.

Further, in a flat-panel X-ray image sensor, since the pixel electrode 57 is used for charge accumulation, the potential thereof tends to fluctuate more than in a liquid crystal or other display device. In order to prevent fluctuation in potential of the pixel electrode 57 from causing malfunction of the TFT 60, it is necessary to suppress this fluctuation as much as possible. For this reason, the auxiliary capacitance 62 connected to the pixel electrode 57 must have a much greater capacitance value than in a liquid crystal display device. However, since there are limits to how much the auxiliary capacitance value can be increased by increasing the width or surface area of the auxiliary capacitance lines 53, decreasing the thickness of the gate insulating film 54 or the oxidation film 53a is considered an effective means of increasing the auxiliary capacitance value.

However, in the conventional structure, decreasing the thickness of the gate insulating film 54 or the oxidation film 53a has the disadvantage of greatly increasing the signal line capacitance value, and thus there are limits to how thin these members can be made. Thus, a drawback with the conventional structure was that is was difficult to increase the auxiliary capacitance value.

Liquid crystal display devices, like flat-panel X-ray image sensors, also have the problem that in the conventional structure the signal line capacitance value tends to become large. Liquid crystal display devices can be expected to become even more high-definition in the future, but increasing definition generally increases the capacitance value of each line, and display quality suffers. Thus, further increase in definition in the future calls for a new active matrix substrate structure capable of reducing signal line capacitance value, which greatly influences display quality.

Further, in order to obtain bright display in a liquid crystal display device, it is especially important to increase aperture ratio. However, in an active matrix substrate with the conventional structure, the auxiliary capacitance lines 53, which block light, occupy a high proportion of the total surface area of the pixel, and thus contribute to reduced aperture ratio when used in a transmittive liquid crystal display device. Further, it is possible to secure the necessary auxiliary capacitance value while improving aperture ratio by decreasing the width of the auxiliary capacitance lines 53 and decreasing the thickness of the gate insulating film 54 or the oxidation film 53a, but, just as in the foregoing flat-panel X-ray image sensor, this tends to increase the signal line capacitance value.

In response to this problem, the conventional art attempted to reduce the signal line capacitance value by, for example, forming a protective film covering the semiconductor domain 64 of the TFT 60 and the glass substrate 51, and then forming on this protective film the source electrode 61, the drain electrode 63, the signal line 56, the pixel electrode 57, etc., as disclosed in Unexamined Japanese Patent Publication No. 60-160173/1985 (Tokukaisho 60-160173, published on Aug. 21, 1985).

In such a structure, however, since contact between the source and drain electrodes 61 and 63 on the one hand and the semiconductor domain 64 on the other is likely to become unstable, the protective film cannot be made too thick, and thus provides insufficient reduction of the signal line capacitance value. Further, the foregoing structure gives no thought to an auxiliary capacitance line 62, and if an auxiliary capacitance line 62 is to be provided, the foregoing structure and the process for manufacturing it become complicated.

As discussed above, in order to reduce noise in a captured image and increase reliability in a flat-panel X-ray image sensor, and to secure display quality and aperture ratio in a high-definition liquid crystal display device, a structure for an active matrix substrate is called for which, first, enables reduction of the signal line capacitance value, and, second, prevents increase of the signal line capacitance value when the thickness of the gate insulating film 54 or the oxidation films 52a and 53a is decreased (when the auxiliary capacitance value is increased).

SUMMARY OF THE INVENTION

It is an object of the present invention to provide an active matrix substrate having a small signal line capacitance value, and to provide an active matrix substrate in which a signal line capacitance value is only slightly increased by increasing an auxiliary capacitance value, in order to realize an image capture device or image display device capable of obtaining a higher quality captured or displayed image.

In order to attain the foregoing object, an active matrix substrate according to the present invention is made up of switching elements, each switching between a source electrode and a drain electrode based on a signal supplied to a gate electrode; scanning lines connected to the gate electrodes; signal lines connected to the source electrodes; and pixel electrodes connected to the drain electrodes; in which a substrate is provided with a layer which forms the scanning lines; a layer, provided above the layer forming the scanning lines, which forms the source electrodes; a layer, provided above the layer forming the source electrodes, which forms the signal lines; and an insulating layer, provided between the layer forming the source electrodes and the layer forming the signal lines; and the scanning lines and the signal lines are provided on opposite sides of the insulating layer from each other.

In the foregoing structure, the substrate is provided with a layer which forms the scanning lines; a layer, provided above the layer forming the scanning lines, which forms the source electrodes; and a layer, provided above the layer forming the source electrodes, which forms the signal lines. Further, an insulating layer is provided between the layer forming the source electrodes and the layer forming the signal lines. In addition, the scanning lines and the signal lines are provided on opposite sides of the insulating layer from each other, extending, for example, in intersecting directions.

The conventional active matrix substrate was structured such that the signal lines and scanning lines were provided on opposite sides of a gate insulating film (which was provided on the scanning lines and the gate electrode). In this structure, the thickness of the gate insulating film was determined in accordance with the specifications of the switching element, and since the electrostatic capacitance value of the gate insulating film is based on the thickness of this film, it was difficult to set a smaller value. For this reason, in areas where a signal line and a scanning line are opposite one another on opposite sides of the gate insulating film, the capacitance value of a signal line capacitance (parasitic capacitance) arising between the signal line and the scanning line increases, thus giving rise to the problem discussed above.

In the structure of the present invention outlined above, however, the signal lines and scanning lines are separated by the insulating layer, which is provided between the layer forming the source electrodes and the layer forming the signal lines. Consequently, the interval between the signal lines and scanning lines separated by the insulating layer can be set to a greater value than the thickness of the gate insulating film in the conventional structure. Thus the capacitance value of the signal line capacitance arising between the signal lines and the scanning lines can be reduced in comparison with the foregoing conventional structure.

Since the foregoing insulating layer is provided between the layer forming the source electrodes and the layer forming the signal lines, it is independent of the specifications of the switching elements, unlike a gate insulating film. Accordingly, the insulating layer can be formed in such a way that the signal line capacitance value is sufficiently reduced.

Specifically, the signal line capacitance value can be sufficiently reduced by forming the insulating layer with a sufficient thickness, and using a material having a small relative dielectric constant.

Further, some conventional active matrix substrates were structured so as to provide an insulator such as a protective film between the semiconductor domain of the switching element and the source electrode. In this case, since, as discussed above, contact between the source electrode and the semiconductor domain tends to become unstable, it is difficult to make the insulator sufficiently thick, and thus difficult to reduce the signal line capacitance value.

In the structure of the present invention outlined above, however, since the layer forming the source electrodes and the layer forming the signal lines are provided separately, it becomes possible to form the source electrodes in close contact with the main body of each switching element (e.g., the semiconductor domain). Accordingly, the thickness of the insulating layer can be increased sufficiently without adversely affecting the functioning of the switching element.

In addition, the source electrode and the signal line can be connected by, for example, a contact hole formed in the insulating layer. Further, since a domain large enough to allow formation of this connection area can be secured away from the switching element, connection will not become unstable.

Accordingly, the foregoing structure makes it possible to provide an active matrix substrate with good switching element functioning, and in which a signal line capacitance arising between the signal lines and the scanning lines has a small capacitance value.

Further, the present invention discloses a method of manufacturing an active matrix substrate in which pixel electrodes are made from the same layer as that of signal lines, and the method includes the step of forming the pixel electrode and the signal line by patterning of a single layer.

In the foregoing method, the signal lines and pixel electrodes are formed by patterning of the same layer (film). In other words, by patterning of a single conductive film made of a single material, the signal lines and the pixel electrodes can be formed in the same process.

Accordingly, the active matrix substrate according to the present invention can be manufactured by modifying part of the pattern of a pattern mask used in forming the pixel electrodes in manufacturing a conventional active matrix substrate. Consequently, in manufacturing the active matrix substrate according to the present invention, it is possible to avoid complication of the manufacturing process, increase of the number of manufacturing steps, etc.

Further, by forming the source electrodes and drain electrodes by patterning of the same layer (film), it is possible to further simplify the manufacturing process.

In order to attain the foregoing object, an active matrix substrate according to the present invention includes signal lines connected to switching elements, scanning lines attached to the switching elements, and a resin material provided between the signal lines and the scanning lines.

In this structure, the signal lines and scanning lines are provided in the active matrix substrate on opposite sides of the resin material, extending, for example, in intersecting directions.

Resin materials generally have a lower relative dielectric constant than, for example, inorganic materials. Accordingly, by providing the signal lines and the scanning lines on opposite sides of a resin material, the capacitance value of an electrostatic capacitance arising between the signal lines and the scanning lines can be reduced. As a result, the signal line capacitance value can be reduced.

Incidentally, in an active matrix substrate provided with auxiliary capacitances, a resin material is preferably provided between the auxiliary capacitance lines forming the auxiliary capacitances and the signal lines. In this way, the signal line capacitance value can be further reduced.

In order to attain the foregoing object, another active matrix substrate according to the present invention is made up of switching elements, switching between a source electrode and a drain electrode based on a signal supplied to a gate electrode; scanning lines connected to the gate electrodes; signal lines connected to the source electrodes; and pixel electrodes connected to the drain electrodes; in which a substrate is provided with a layer which forms the signal lines; a layer, provided above the layer forming the signal lines, which forms the gate electrodes; a layer, provided above the layer forming the gate electrodes, which forms the scanning lines; and an insulating layer, provided between the layer forming the gate electrodes and the layer forming the scanning lines; and the scanning lines and the signal lines are provided on opposite sides of the insulating layer from each other.

In the foregoing structure, the substrate is provided with a layer which forms the signal lines; a layer, provided above the layer forming the signal lines, which forms the gate electrodes; and a layer, provided above the layer forming the gate electrodes, which forms the scanning lines. Further, an insulating layer is provided between the layer forming the gate electrodes and the layer forming the scanning lines. In addition, the scanning lines and the signal lines are provided on opposite sides of the insulating layer from each other, extending, for example, in intersecting directions.

In this structure, as in the structure described above (in which a layer forming the scanning lines, a layer forming the source electrodes, and a layer forming the signal lines are provided on the substrate in that order), the scanning lines and the signal lines are provided on opposite sides of the insulating layer (which is provided between the layer forming the gate electrodes and the layer forming the scanning lines). Consequently, the capacitance value of the signal line capacitance arising between the scanning lines and the signal lines can be reduced.

In addition, the gate electrode and the scanning line can be connected by, for example, a contact hole formed in the insulating layer. Further, since a domain sufficient to form this connection area can be secured away from the switching element, connection will not become unstable.

Accordingly, this structure makes it possible to provide an active matrix substrate with good switching element functioning, and in which a signal line capacitance arising between the signal lines and the scanning lines has a small capacitance value.

In order to attain the foregoing object, a flat-panel image sensor according to the present invention is made up of the foregoing active matrix substrate provided with pixel electrodes, and a photoelectric conversion layer electrically connected to the pixel electrodes of the active matrix substrate.

This structure provides a flat-panel image sensor in which pixel electrodes function as charge-collecting electrodes. Further, this structure provides a flat-panel image sensor which includes the foregoing active matrix substrate having a small signal line capacitance value. Consequently, it is possible to suppress increase of the time needed to read the charges due to a large signal line capacitance, and to suppress superimposition of noise on the signal of the signal line due to the influence of the scanning lines, auxiliary capacitance lines, pixel electrodes, etc.

Additional objects, features, and strengths of the present invention will be made clear by the description below. Further, the advantages of the present invention will be evident from the following explanation in reference to the drawings.

DESCRIPTION OF THE EMBODIMENTS

First Embodiment

The following will explain one embodiment of the present invention with reference to FIGS. 1 through 5 and 9 through 11.

Figure 1:
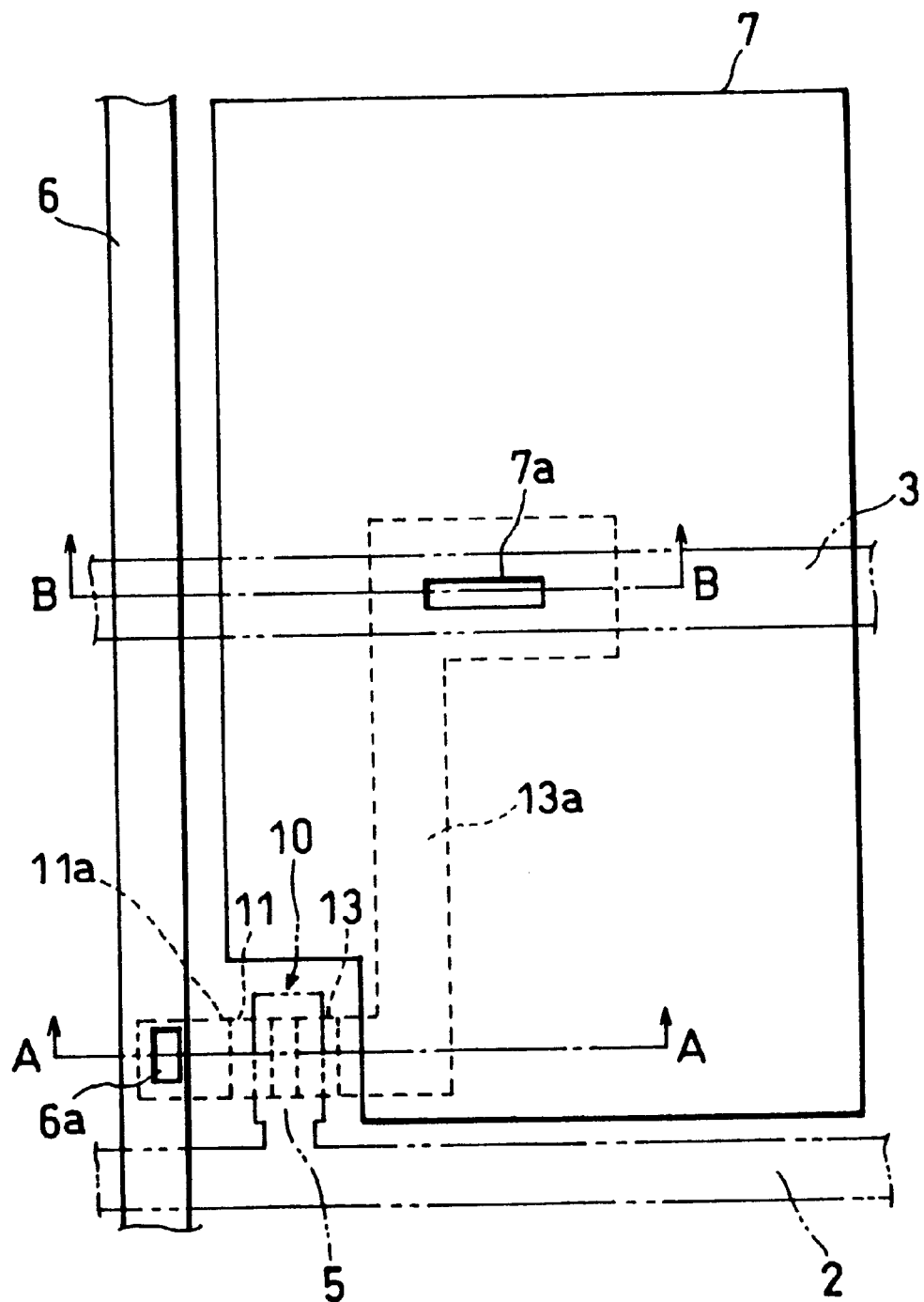
FIG. 1 is a plan view of an active matrix substrate according to a first embodiment of the present invention.

FIG. 1 is a plan view of an active matrix substrate according to the present embodiment, structured as follows. A plurality of scanning lines 2 and signal lines 6 are arranged in a lattice form on a glass substrate 1 (substrate) (see FIGS. 2 and 3), and a switching element and a pixel electrode 7 are provided for each area where a scanning line 2 and a signal line 6 cross.

Each of the switching elements is a thin-film transistor (hereinafter referred to as "TFT") 10 having a gate electrode 5, a source electrode 11, and a drain electrode 13. The gate electrode 5 is connected to the signal line 2, the source electrode 11 is connected to the signal electrode 6 via a source line 11a and a contact hole 6a, and the drain electrode 13 is connected to the pixel electrode 7 via a drain line 13a and a contact hole 7a. Further, below the contact hole 7a is provided an auxiliary capacitance line 3 (see FIG. 3), which forms an auxiliary capacitance 12 with the drain line 13a.

Figure 2:
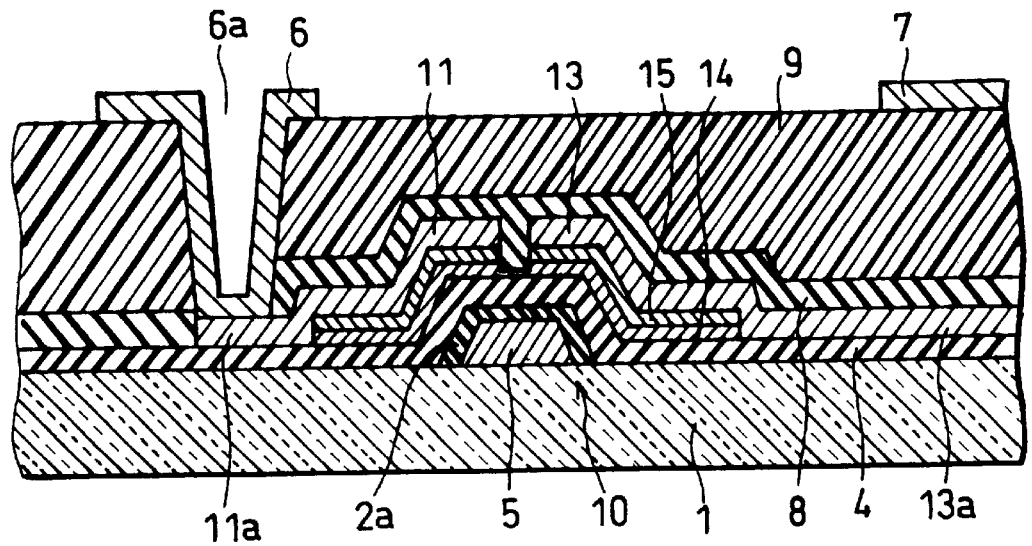
FIG. 2 is a cross-sectional view taken at line A—A of FIG. 1.
Figure 3:
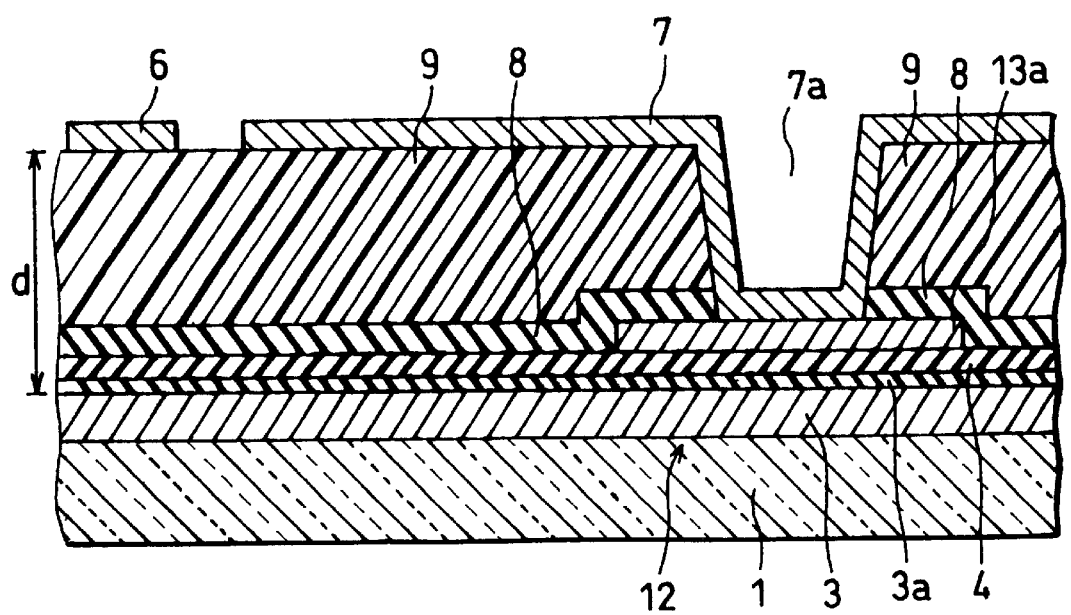
FIG. 3 is a cross-sectional view taken at line B—B of FIG. 1.

FIGS. 2 and 3 are cross-sectional views of the foregoing active matrix substrate, taken at lines A—A and B—B, respectively, of FIG. 1. On the insulative glass substrate 1 are provided the gate electrode 5, the scanning line 2 (see FIG. 1), and the auxiliary capacitance line 3 (these make up the first layer, i.e., the layer forming the gate electrodes 5 and the scanning lines 2). On the surfaces of these elements oxidation films 2a and 3a (anodic oxidation (AO) films; insulating films) are provided by anodic oxidation. Then a gate insulating film 4 (first insulating film; second insulating film; insulating film) made of a film of a silicon-based compound such as silicon nitride ($SiN_x$) or silicon dioxide ($SiO_2$) is provided on the gate electrode 5, the scanning line 2 and the auxiliary capacitance line 3, and on the areas of the glass substrate 1 not provided with these members.

Incidentally, the oxidation film 2a (first insulating film) is provided on the gate electrode 5 and the scanning line 2 (see FIG. 1), and the oxidation film 3a (second insulating film) is provided on the auxiliary capacitance line 3.

The gate electrode 5 is formed as a branch of the scanning line 2, and on that part of the gate insulating film 4 above the gate electrode 5, a semiconductor domain 14 (amorphous silicon channel layer; i layer; semiconductor layer) and a contact layer 15 (n-type silicon layer; $n^+$ layer) are provided. Further, on the contact layer 15 are provided the source electrode 11 and the drain electrode 13 (second layer; layer forming source and drain electrodes 11 and 13). The foregoing members (gate electrode 5, gate insulating film 4, semiconductor domain 14, contact layer 15, source electrode 11, and drain electrode 13) make up a TFT 10 as a switching element, one of which is provided in each pixel.

The source electrode 11 of the TFT 10 extends down to the gate insulating film 4, thus forming a source line 11a. The source line 11a is connected to the signal line 6 (to be discussed below). Further, the drain electrode 13 also extends down to the gate insulating film 4, forming a drain line 13a.

The drain line 13a extends to a position above the auxiliary capacitance line 3, and is also provided on the gate insulating film 4 above the auxiliary capacitance line 3. Here, the auxiliary capacitance line 3 and the drain line 13a are in part provided opposite one another, on opposite sides of the oxidation film 3a (dielectric layer) and the gate insulating film 4 (dielectric layer), thus forming an auxiliary capacitance 12 (electrostatic capacitance). Further, the drain line 13a is connected to the pixel electrode 7 (to be discussed below).

A protective layer 8 (insulating layer) made of a silicon compound is provided so as to cover all the foregoing members, and an inter-layer insulating film 9 (insulating layer) is provided on the protective layer 8. The signal line 6 and the pixel electrode 7 (third layer; layer forming the signal line 6 and pixel electrode 7) are provided on the inter-layer insulating film 9.

The signal line 6 is connected to the source line 11a via a contact hole 6a formed in the inter-layer insulating film 9 and the protective layer 8, thus allowing transmission of signals between the signal line 6 and the source electrode 11.

In the same way, the pixel electrode 7 is connected to the drain line 13a via a contact hole 7a formed in the inter-layer insulating film 9 and the protective layer 8, thus allowing transmission of signals between the drain electrode 13 and the pixel electrode 7. Further, the pixel electrode 7 is also connected to the auxiliary capacitance 12 via the contact hole 7a.

Since the contact holes 6a and 7a can be provided away from the TFT 10, domains sufficient to form the connection areas can be secured, and connection will not become unstable.

Next, a method of manufacturing the active matrix substrate according to the present embodiment, structured as above, will be explained with reference to FIGS. 2 and 3.

First, a single-layer film of aluminum (Al), molybdenum (Mo), Tantalum (Ta), etc., or a multi-layer film of several of these, is formed by sputtering on the insulative glass substrate 1. Then, by photolithography, this film is patterned into a predetermined shape to form the scanning lines 2 (see FIG. 1) and the gate electrodes 5 as branches of the scanning lines 2, and the auxiliary capacitance lines 3. Then, by anodic oxidation of the entire surface of each of these members, the oxidation films 2a and 3a (AO films) are formed. Here, by patterning of a single film, both the scanning lines 2 and the auxiliary capacitance lines 3 are formed as a plurality of lines parallel to and alternating with each other.

Next, plasma CVD is used to form the gate insulating film 4 of a silicon nitride ($SiN_x$) film, the semiconductor domain 14 of an amorphous silicon film, and the contact layer 15 of an n-type silicon film, in that order. The semiconductor domain 14 forms the channel of the TFT 10, and the contact layer 15 is a layer for providing electrical contact between the terminals of the semiconductor domain 14 and the source electrode 11 and drain electrode 13, respectively. Then the foregoing amorphous silicon film and n-type silicon film are simultaneously patterned, thus forming a domain constituting the TFT 10.

Then the gate insulating film 4 is patterned to form signal input terminals (not shown) for the scanning lines 2 and contact areas (not shown) for contact with main lines (not shown) which connect together the auxiliary capacitance lines 3.

Next, a film of ITO (indium tin oxide), tantalum, or aluminum, etc. is deposited by sputtering, and by patterning into a predetermined shape, the source electrode 11, source line 11a, drain electrode 13, and drain line 13a are formed. Here, the drain line 13a is formed so as to extend to above the auxiliary capacitance line 3.

Next, by dry etching using the source electrode 11 and the drain electrode 13 as resist, the n-type silicon film is separated into source and drain sides, thus completing the TFT 10 as a switching element.

Then, over the entire surface of the glass substrate 1 provided with the TFTs 10, a silicon nitride film is formed and patterned as the protective film 8, after which the protective film 8 is removed at the contact hole 6a for electrically connecting the source line 11a with a signal line 6 to be formed in an upper layer, the contact hole 7a for electrically connecting the pixel electrode 7 to the drain line 13a, and at terminal areas (not shown) for connection to a driving circuit, readout circuit etc.

Incidentally, by forming the protective layer 8 of, for example, a stable inorganic material such as the foregoing silicon nitride, the TFT 10 is protected from damage with certainty.

Then the inter-layer insulating film 9 is formed on the protective layer 8. In order to form the inter-layer insulating film 9, a resin having photosensitivity (photosensitive resin; resin material) is coated on, exposed, and developed, and then patterned into a predetermined shape. Then, as in the case of the protective film 8, the inter-layer insulating film 9 is removed at the contact holes 6a and 7a, etc.

Incidentally, coating of the resin during formation of the inter-layer insulating film 9 may be by means of a film formation method such as spin coating. With spin coating, it is easy to form a comparatively thick resin film of, say, around 1 $\mu$m to 5 $\mu$m. An inter-layer insulating film 9 formed in this way can flatten out differences in surface height where the TFT 10 and other members are formed.

Further, since it generally has a smaller relative dielectric constant than inorganic materials, resin is preferable as a material for forming the inter-layer insulating film 9. Acrylic resin, in particular, is preferable because it has a relative dielectric constant of approximately 3, which is even lower than that of other resins like polyimide.

Then the signal lines 6 and the pixel electrodes 7 are simultaneously formed on the inter-layer insulating film 9 by depositing a film of ITO, tantalum, or aluminum, etc. by sputtering and then by patterning the film into a predetermined shape.

Incidentally, in FIG. 1, the pixel electrode 7 is formed so as not to overlap the TFT 10, but it may alternatively be positioned so as to overlap the TFT 10.

In the foregoing manufacturing method, since the signal lines 6 and the pixel electrodes 7 are formed simultaneously by patterning of a single layer, both members can be realized merely by modifying a photomask used conventionally. Accordingly, since there is no cost increase over the conventional method, cost increase can be suppressed.

Incidentally, the foregoing explained a case in which the signal lines 6 and the pixel electrodes 7 are made from the same layer, but there is no limitation to this; in order to reduce signal line capacitance (parasitic capacitance; electrostatic capacitance), it is sufficient if the signal lines 6 are provided on the inter-layer insulating film 9. The main reason to form the signal lines 6 and the pixel electrodes 7 from the same layer is simplification of the manufacturing process.

Accordingly, when, as in a transmittive liquid crystal display device, it is necessary that the pixel electrodes 7 be transparent electrodes and the signal lines 6 be metal lines having higher conductivity than the transparent electrodes, these members may be formed on different respective layers.

The following will show that in the active matrix substrate according to the present embodiment, structured as above, signal line capacitance value has been greatly reduced in comparison with a conventional active matrix substrate. The following will consider an electrostatic capacitance value between the signal line 6 on the one hand and the scanning line 2 and auxiliary capacitance line 3 on the other, which accounts for most of the signal line capacitance value.

Figure 6:
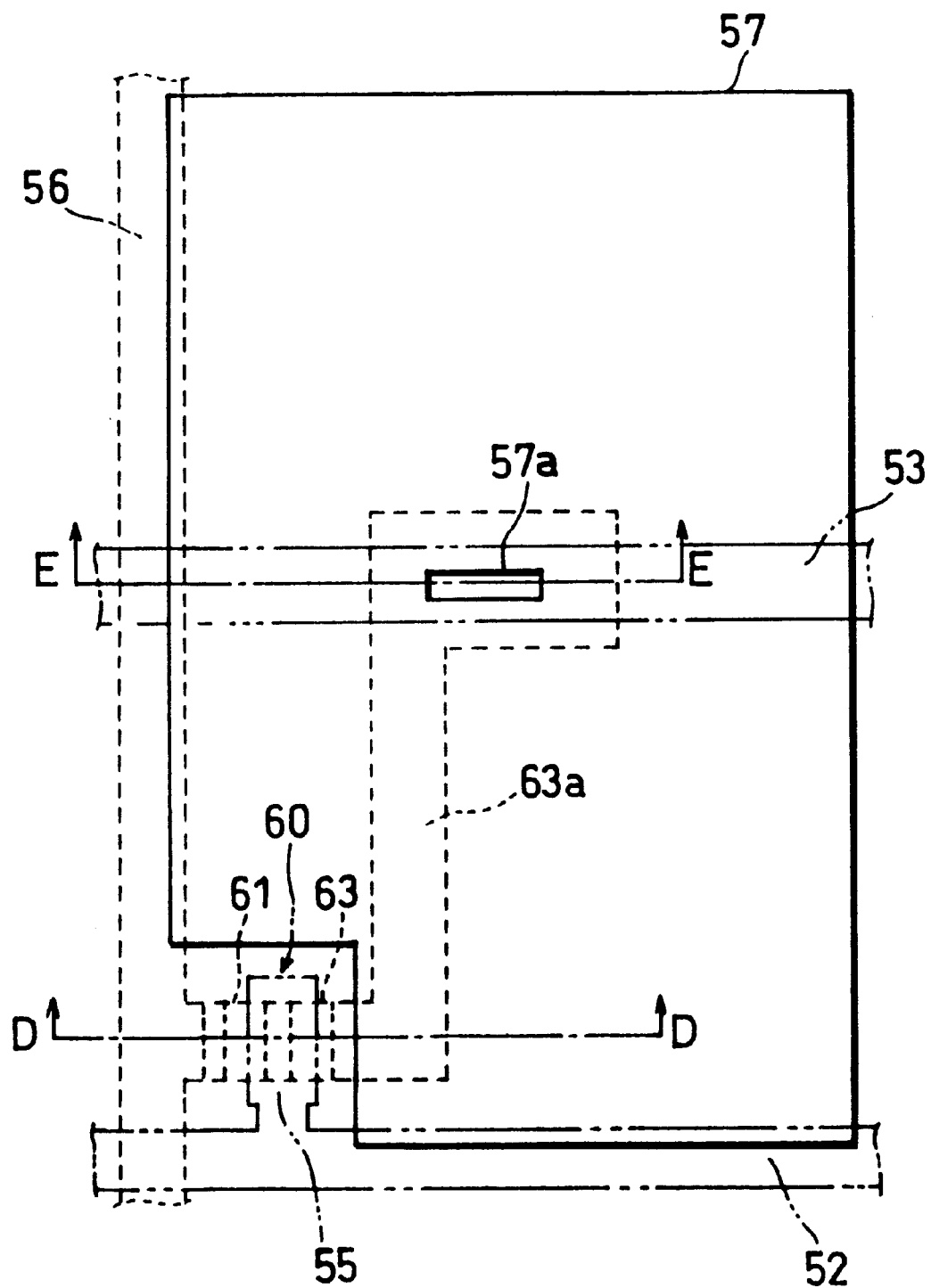
FIG. 6 is a plan view of a conventional active matrix substrate.
Figure 7:
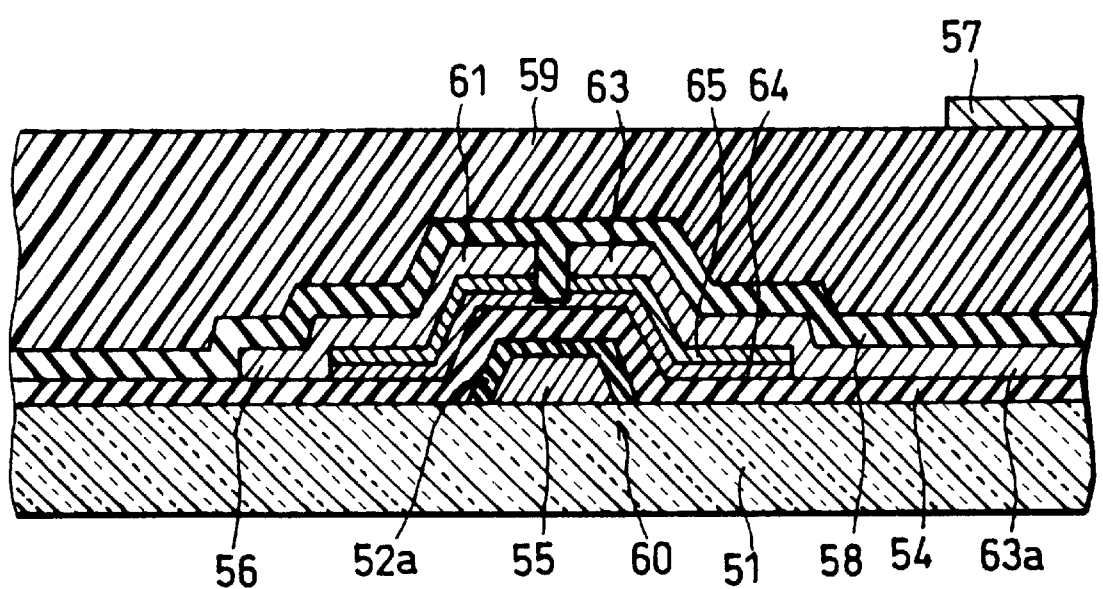
FIG. 7 is a cross-sectional view taken at line D—D of FIG. 6.
Figure 8:
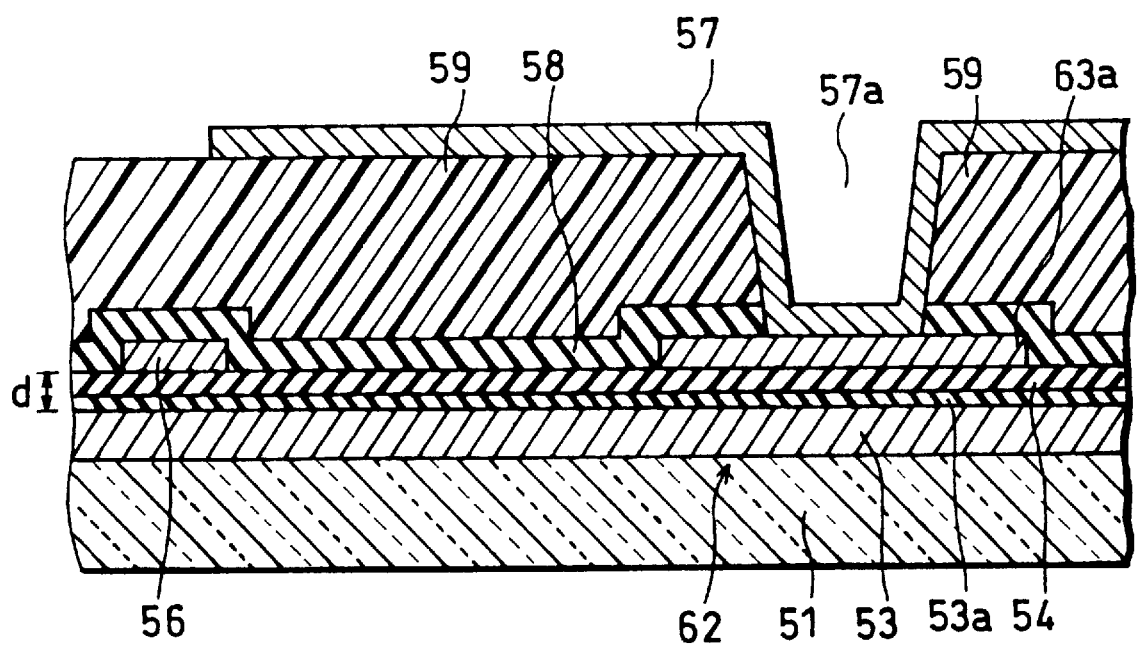
FIG. 8 is a cross-sectional view taken at line E—E of FIG. 6.

As a typical example, the following will consider a case in which the oxidation films 2a and 3a have a thickness of 0.15 $\mu$m and a relative dielectric constant of 24, the gate insulating film 4 a thickness of 0.35 $\mu$m and a relative dielectric constant of 6.9, the protective film 8 a thickness of 0.5 $\mu$m and a relative dielectric constant of 6.9, and the inter-layer insulating film a thickness of 3 $\mu$m and a relative dielectric constant of 3. Further, these values are equivalent in the conventional active matrix substrate (see FIGS. 6–8) and that of the present embodiment.

In the conventional active matrix substrate, the signal line 56 and the scanning line 52 or auxiliary capacitance line 53 were separated only by the gate insulating film 54 and the oxidation layers 52a and 53a (see FIGS. 7 and 8), but in the present embodiment, the signal line 6 and the scanning line 2 or the auxiliary capacitance line 3 are separated by the gate insulating film 4, the oxidation layers 2a and 3a, the protective layer 8, and the inter-layer insulating film 9.

Calculation of the electrostatic capacitance value for 1$\mu$m$^2$ of overlap with the signal line 6 yielded a result of 0.16 fF/$\mu$m$^2$ for the conventional active matrix substrate, and 0.0078 fF/$\mu$m$^2$ for the present embodiment. In the present embodiment, providing the signal line 6 on the inter-layer insulating film 9 increases an interval d between the signal line 6 and the scanning line 2 or the auxiliary capacitance line 3 to approximately 4 $\mu$m. As a result, the value of electrostatic capacitance parasitic on the signal line 6 is greatly reduced, to ½₀ of that in the conventional art.

Incidentally, the active matrix substrate according to the present embodiment can be used, for example, in active-matrix-type display devices (such as a liquid crystal display device) and flat-panel image sensors (such as a flat-panel X-ray image sensor). However, as explained in the foregoing discussion of the background art, when using the active matrix substrate in a flat-panel image sensor, there are cases in which the auxiliary capacitance value must be set higher than it is in an active-matrix-type display device.

Figure 9:
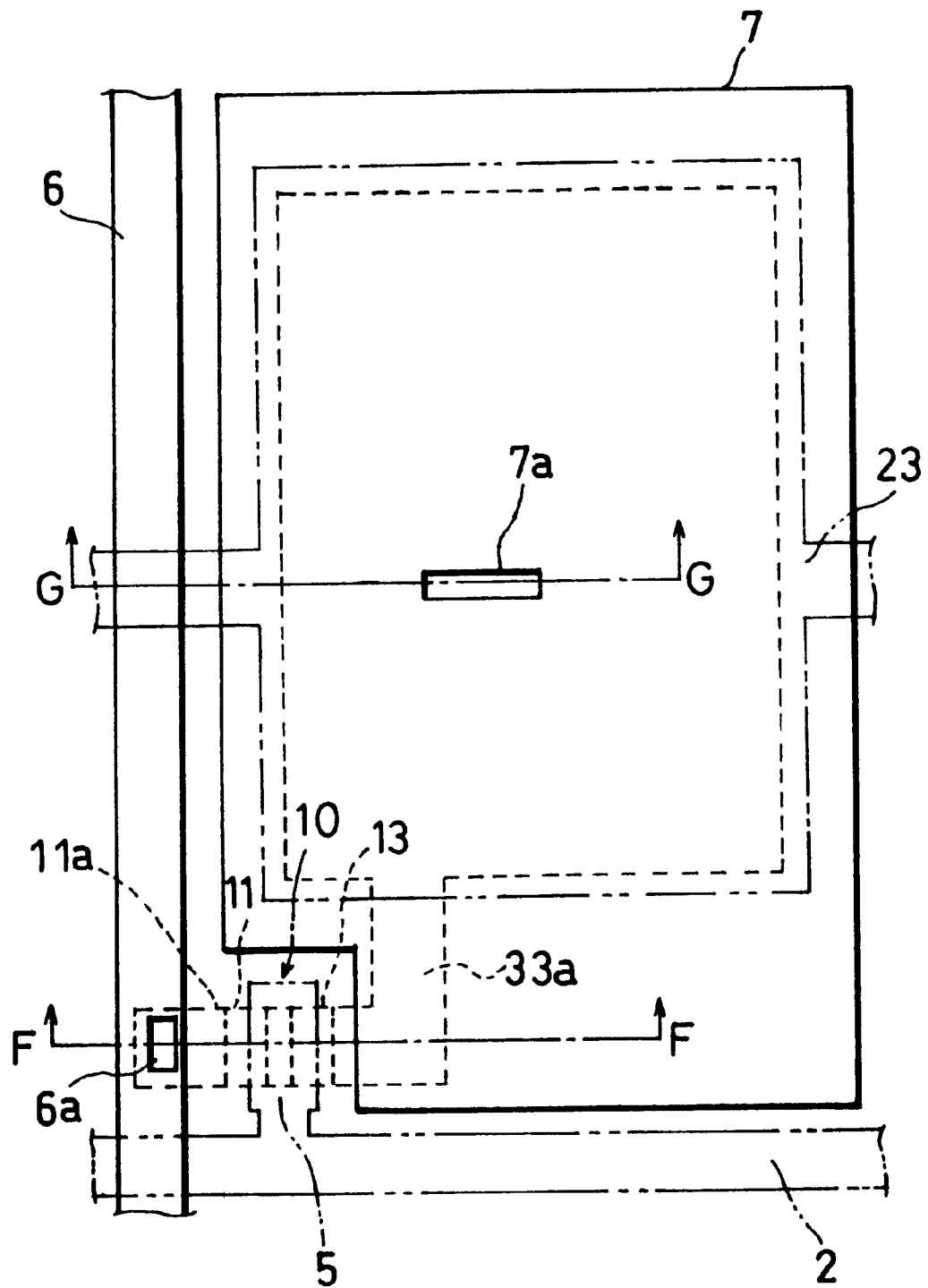
FIG. 9 is a plan view of an active matrix substrate according to another modification of the first embodiment of the present invention.
Figure 10:
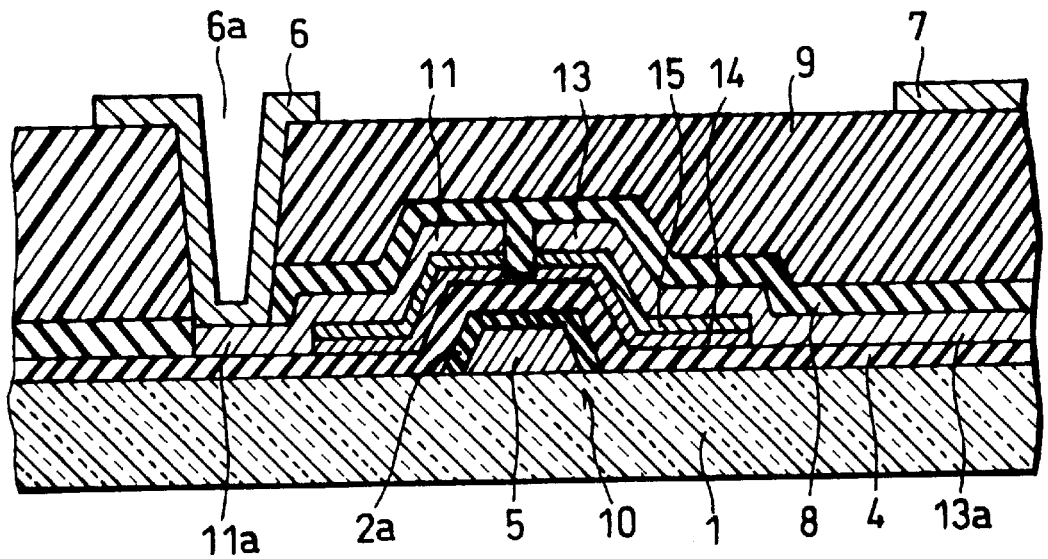
FIG. 10 is a cross-sectional view taken at line F—F of FIG. 9.
Figure 11:
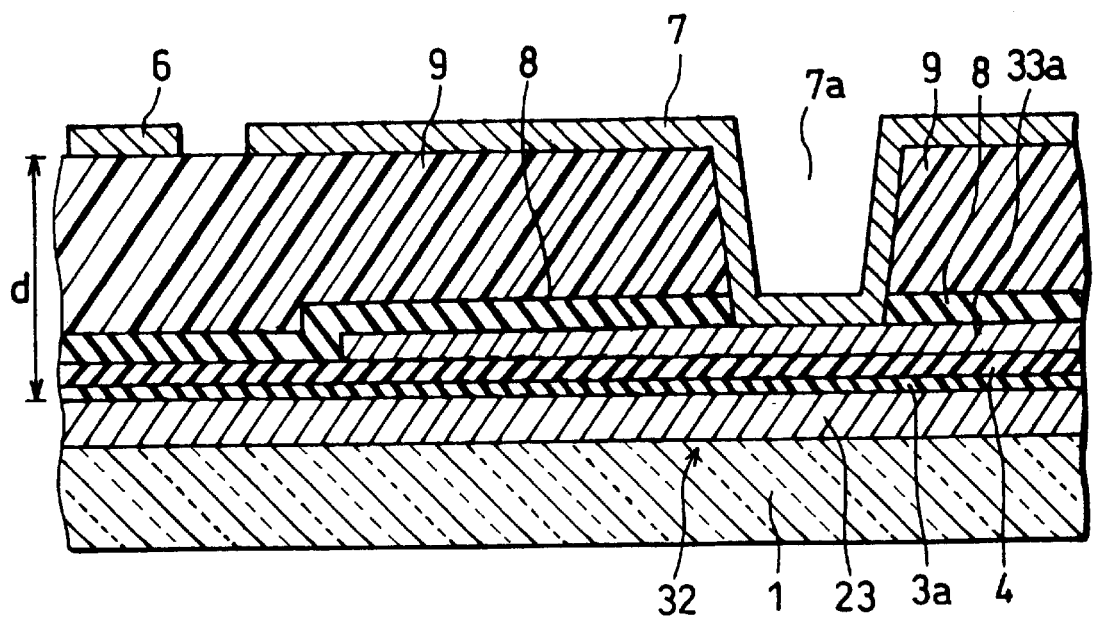
FIG. 11 is a cross-sectional view taken at line G—G of FIG. 9.

In such a case, based on the active matrix substrate shown in FIG. 1, the layout of the auxiliary capacitance may be freely modified, to that of the auxiliary capacitance 32 shown in FIGS. 9 through 11. Here, FIG. 9 is a plan view of an active matrix substrate according to a modification of the present embodiment, and FIGS. 10 and 11 are cross-sectional views taken at lines F—F and G—G, respectively, of FIG. 9. Members in FIGS. 9 through 11 having the same functions as those shown in FIGS. 1 through 3 will be given the same reference symbols, and explanation thereof will be omitted here. Further, the structure shown in FIG. 10 is the same as that shown in FIG. 2 discussed above.

In this active matrix substrate, as shown in FIGS. 9 through 11, an auxiliary capacitance line 23 and a drain line 33a, which make up the auxiliary capacitance 32, are laid out so as to occupy most of the surface area in the pixel. These members make up the auxiliary capacitance 32.

The active matrix substrate shown in FIG. 1 was provided with an auxiliary capacitance line 3 having a uniform width. In the active matrix substrate shown in FIG. 9, in contrast, the auxiliary capacitance line 23 is formed so that its width is narrow beneath the signal line 6 (the same width as in FIG. 1, for example), and wider beneath the pixel electrode 7. Further, the drain line 33a is also extended along with the auxiliary capacitance line 23, and has a surface area close to that of the auxiliary capacitance line 23.

By increasing the surface area of the auxiliary capacitance line 23 and the drain line 33a, the capacitance value of the auxiliary capacitance 32 can be increased. When further increase of the capacitance value of the auxiliary capacitance is needed, the oxidation film 3a and the gate insulating film 4 between the auxiliary capacitance line 23 and the drain line 33a may be reduced in thickness, within a range in which switching characteristics of the TFT 10 can be secured.

In the present embodiment, regardless of how much the gate insulating film 4 and the oxidation films 2a and 3a are reduced in thickness, the interval d will never be less than 3.5 $\mu$m, which is the total thickness of the inter-layer insulating film 9 and the protective layer 8. Accordingly, a capacitance value arising in a portion of the signal line 6 overlapping with the scanning line 2 or the auxiliary capacitance line 23 is barely increased, and in any case will never be more than 0.0083 $fF/\mu m^2$.

In this way, in the active matrix substrate according to the present embodiment, the signal line capacitance value is greatly reduced, and even if the gate insulating film 4 and the oxidation films 2a and 3a are reduced in thickness, the accompanying increase in signal line capacitance value is very small.

The active matrix substrate according to the present embodiment (FIGS. 1 through 3) is provided with an auxiliary capacitance line 3 for forming the auxiliary capacitance 12 with the drain line 13a. However, in the present embodiment, the auxiliary capacitance line 3 is not necessarily required; it is also possible to form the auxiliary capacitance 12 using the scanning line 2 of the adjacent pixel.

Figure 4:
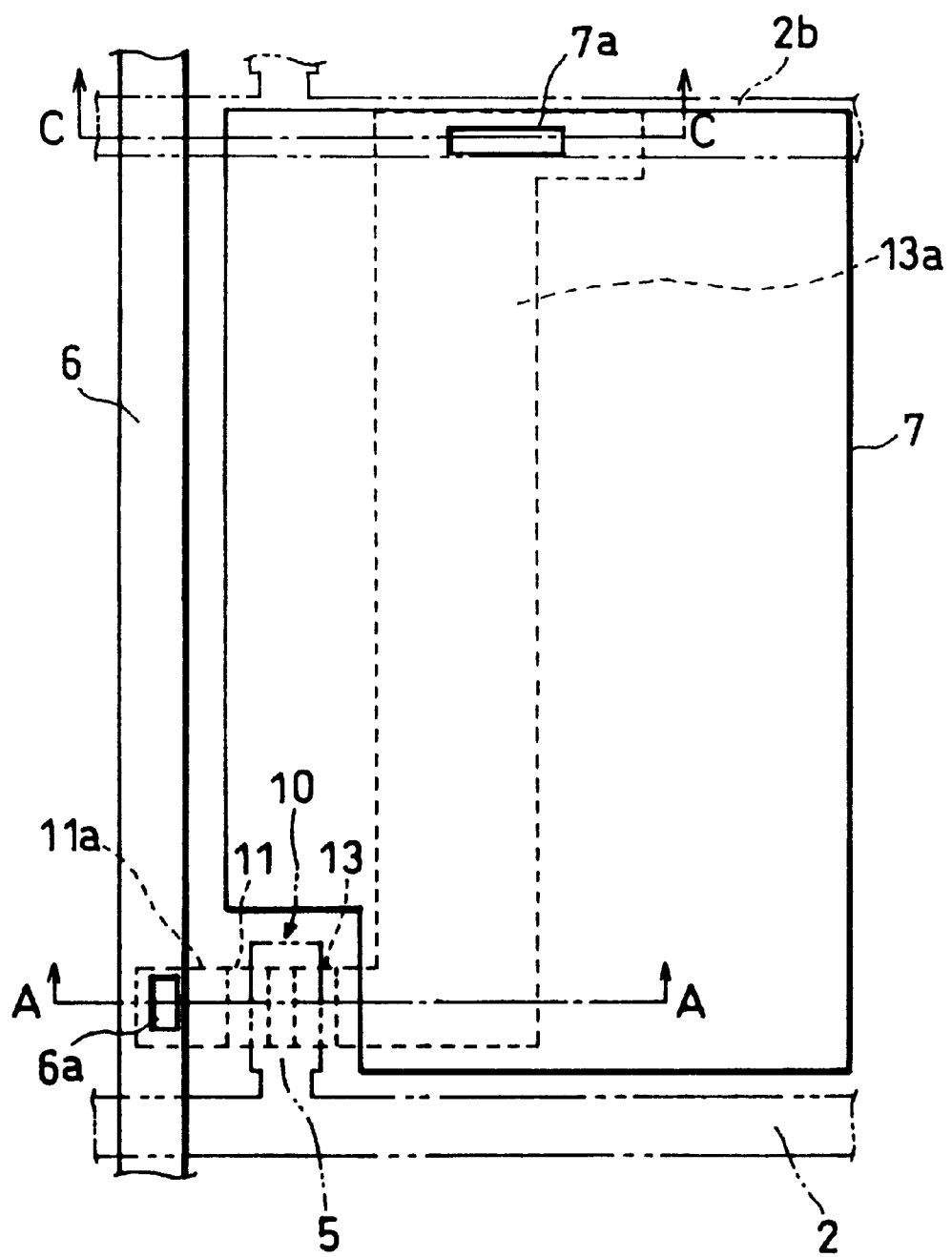
FIG. 4 is a plan view of an active matrix substrate according to a modification of the first embodiment of the present invention.
Figure 5:
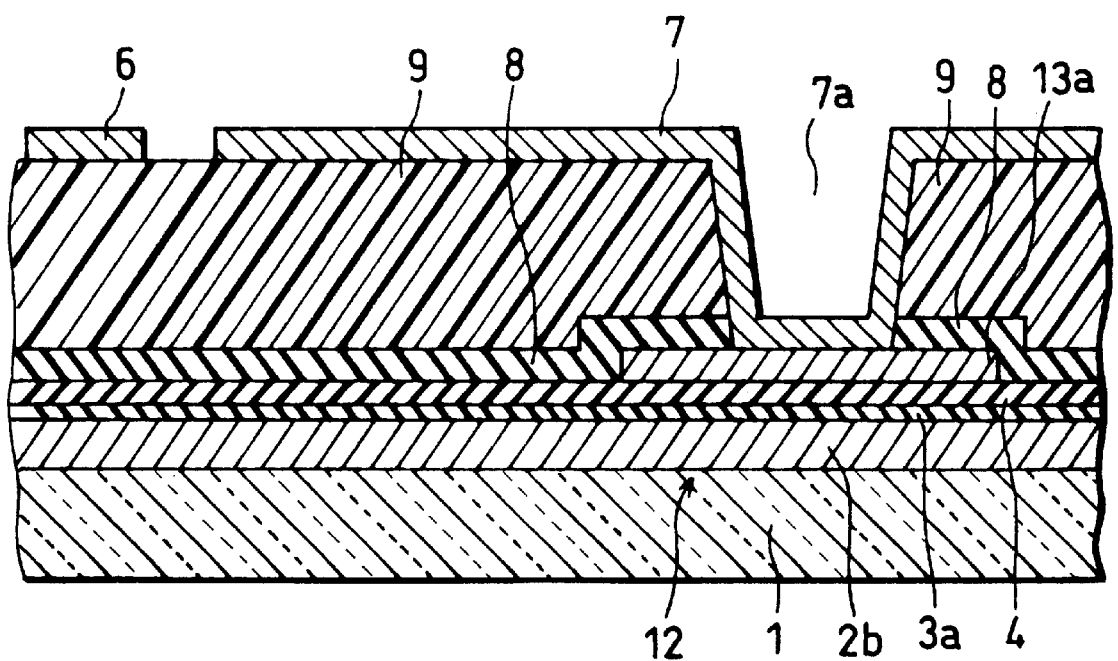
FIG. 5 is a cross-sectional view taken at line C—C of FIG. 4.

Such a structure not provided with an auxiliary capacitance line 3 is commonly known as a Cs-on-gate structure. The following will explain, with reference to FIGS. 2, 4, and 5, a modification of the present embodiment having a Cs-on-gate structure. In FIGS. 4 and 5, members having the same functions as those shown in FIGS. 1 and 3 will be given the same reference symbols, and explanation thereof will be omitted here. Further, since the cross-section taken at line A—A of FIG. 4 is equivalent to that shown in FIG. 2, explanation thereof will also be omitted here.

FIG. 4 is a plan view of an active matrix substrate according to this modification of the present embodiment. Here, the differences with the active matrix substrate shown in FIG. 1 are that no auxiliary capacitance line 3 is provided, and that the drain line 13a extends to a position above the adjacent scanning line 2b, so that the drain line 13a and the adjacent scanning line 2b, separated by the gate insulating film 4, etc., overlap in part.

FIG. 5 is a cross-sectional view taken at line C—C of FIG. 4. Here, the difference with FIG. 3 is that the auxiliary capacitance line 3 of FIG. 1 is replaced in FIG. 5 by the adjacent scanning line 2b. Accordingly, the auxiliary capacitance 12 is formed where the drain line 13a and the adjacent scanning line 2b are opposite one another.

In this case as well, the capacitance value of the signal line capacitance arising between the signal line 6 and the scanning line 2 can be greatly reduced. Further, since the auxiliary capacitance line 3 is not provided, no electrostatic capacitance arises between the signal line 6 and an auxiliary capacitance line 3 provided independently of the scanning line 2.

The present modification is structurally simpler than the other structures described in the present embodiment. However, especially when an extremely large auxiliary capacitance is required, as in an image sensor, using the adjacent scanning line 2b for the auxiliary capacitance 12 tends to increase the time constant of the scanning line 2, aggravating the problem of delay in signals transmitted by the scanning line; and tends to increase a noise component applied to the pixel during rise or decay in potential of the adjacent scanning line 2b, which may adversely affect the S/N ratio.

When, on the other hand, the auxiliary capacitance line 3 is provided separately from the scanning line 2, application of a DC signal to the auxiliary capacitance line 3 is sufficient, and thus there is no problem with signal delay, nor with noise influencing the pixel.

Further, in the conventional structure, in which the signal line crossed the scanning line and the auxiliary capacitance line with only a thin gate insulating film therebetween, the signal line crossed two lines (scanning line and auxiliary capacitance line) for each pixel, leading to the drawback of increase of the signal line capacitance value. However, since the structure of the present embodiment does not give rise to this unwanted effect, the advantages of the present embodiment are particularly great when the scanning line 2 and the auxiliary capacitance line 3 are provided separately.

Further, with the active matrix substrate according to the present embodiment, by providing the pixel electrode 7 with a structure for generating electrons and holes from incident electromagnetic waves such as X-rays or visible light (photoelectric conversion layer), and providing a counter electrode above that and applying a voltage between these two members, a charge generated in the photoelectric conversion layer by incident electromagnetic waves such as X-rays or visible light can be collected in the pixel electrode 7. Here, the photoelectric conversion layer is made of a-Se, CdTe, or $PbI_2$, for example.

Here, the pixel electrode 7 functions as a charge-collecting electrode, and a flat-panel image sensor is formed. In this case, since small quantities of charge generated by weak electromagnetic radiation are read out, noise attributable to the signal line capacitance must be reduced as much as possible, and thus the present embodiment is particularly effective. A flat-panel image sensor will be further discussed later.

As discussed above, an active matrix substrate according to the present embodiment, as shown in FIGS. 1 through 5 and 9 through 11, includes scanning lines 2 provided on a glass substrate 1; TFTs 10 provided on the glass substrate 1, each having a gate electrode 5 connected to one of the scanning lines 2; pixel electrodes 7, each connected to a drain electrode 13 of one of the TFTs 10; and signal lines 6, each connected to a source electrode 11 of one of the TFTs 10; in which the signal lines 6 and the pixel electrodes 7 are made from the same layer, and an insulating layer (protective film 8, inter-layer insulating film 9, etc.) is provided between the layer forming the signal lines 6 and pixel electrodes 7 and a layer forming the drain and source electrodes 13 and 11.

In the foregoing structure, an insulating layer separates the signal lines 6 (which are formed from the same layer as that of the pixel electrodes 7) from the layer forming the source and drain electrodes 11 and 13 of the TFTs 10 (which are formed on the glass substrate 1). Accordingly, the scanning lines 2 provided on the glass substrate 1 are separated from the signal lines 6 by at least the insulating layer. By means of this structure, the insulating layer can reduce the capacitance value of the signal line capacitance formed between the signal lines 6 and the scanning lines 2.

Accordingly, it is possible to prevent increase of the time constant of the signal lines 6, scanning lines 2, etc. due to the signal line capacitance, and to increase the speed at which signals are transmitted by the signal lines 6, scanning lines 2, etc. Further, noise attributable to the signal line capacitance can also be reduced.

Since the source and drain electrodes 11 and 13 (i.e., the TFT 10) are also separated from the signal lines by the insulating layer, the source and drain electrodes 11 and 13 can be kept in close contact with the switching element main body (the semiconductor domain 14) even if the thickness of the insulating layer is increased to reduce the signal line capacitance.

Accordingly, contact between the source and drain electrodes 11 and 13 on the one hand and the semiconductor domain 14 on the other will not become unstable. In addition, since this allows the thickness of the insulating layer to be increased, the signal line capacitance can be further reduced.

As a result, an active matrix substrate can be provided for use in an image display device or image capture device which is reliable and capable of displaying or capturing images of high quality.

Further, the foregoing active matrix substrate is preferably provided with auxiliary capacitances 12 or 32 (hereinafter written "auxiliary capacitances 12/32"; other members will also be referred to using similar notation) formed between the insulating layer and the glass substrate 1, each connected to one of the pixel electrodes 7 in series, and auxiliary capacitance lines 3/23, each forming one electrode of an auxiliary capacitance 12/32.

With this structure, the auxiliary capacitance lines 3/23, like the scanning lines 2, are separated from the signal lines 6 by at least the insulating layer. Consequently, the insulating layer can reduce the capacitance value of the signal line capacitance formed between the signal lines 6 and the auxiliary capacitance lines 3/23. Accordingly, signal line capacitance attributable both to the scanning lines 2 and to the auxiliary capacitance lines 3/23 can be reduced, thus greatly reducing the capacitance value of the signal line capacitance.

An active matrix substrate according to the present embodiment may be made up of pixel electrodes 7 arranged in matrix form on a glass substrate 1; TFTs 10, each provided with a drain electrode 13 connected to one of the pixel electrodes 7, and provided with a gate electrode 5 and a source electrode 11; scanning lines 2, each connected to one of the gate electrodes 5; and signal lines, each connected to one of the source electrodes 11; in which the scanning lines 2 and the signal lines 6 are arranged in lattice form on the glass substrate 1, extending in intersecting directions; and the glass substrate 1 is provided with an insulating layer (protective film 8, inter-layer insulating film 9, etc.) covering the scanning lines 2 and the TFTs 10; and the pixel electrodes 7 and the signal lines 6 are provided on the insulating layer.

With this structure, since at least the insulating layer is provided between the scanning lines 2 and the signal lines 6, the insulating layer can reduce the capacitance value of the signal line capacitance formed where a scanning line 2 lies opposite a signal line 6.

In other words, in this structure, the insulating layer is provided between the scanning lines 2 and the TFTs 10 on the one hand and the signal lines 6 on the other. Accordingly, the capacitance value of the signal line capacitance formed with the scanning lines 2 can be reduced while still maintaining close contact between the semiconductor domain 14 and the electrodes of the TFT 10. As a result, an active matrix substrate can be provided which is highly reliable and capable of display or capture of high-quality images.

Further, since the pixel electrode 7 is provided on top of the insulating film, the pixel electrode 7 can be provided so as to be exposed. Accordingly, when a liquid crystal display device or an image sensor is formed using the present active matrix substrate, the pixel electrode 7 and the liquid crystal layer or photoelectric conversion layer can be provided in close proximity, thus smoothing (expediting) transmission of a potential or a charge between the pixel electrode 7 and the layer in question.

Further, since an interval between the source and drain electrodes 11 and 13 and the gate electrode 5 in the TFT 10 is not particularly related to the insulating layer, functioning of the TFT 10 is not affected by changing the thickness of the insulating layer. Accordingly, the thickness of the insulating layer can be increased sufficiently to provide a sufficient reduction in the signal line capacitance value.

Further, in the foregoing active matrix substrate, the signal lines 6 and the pixel electrodes 7 are preferably made from the same layer.

With this structure, the signal lines 6 and the pixel electrodes 7 can be formed by patterning of a single layer, and thus, by merely modifying a patterning mask conventionally used in forming the pixel electrodes, the present active matrix substrate can be manufactured without increasing the number of manufacturing steps. Accordingly, cost increase due to structural modification can be held to a minimum.

Further, the foregoing active matrix substrate preferably also includes drain lines 13a/33a extending from the drain electrodes 13/33; and auxiliary capacitance lines 3/23 made from the same layer as that of the scanning lines 2 and overlapping in part with the drain lines 13a/33a; in which a gate insulating film 4 is provided between the auxiliary capacitance lines 3/23 and the drain lines 13a/33a.

With this structure, providing the gate insulating film 4 between the auxiliary capacitance lines 3/23 and the drain lines 13a/33a can form the auxiliary capacitance 12/32. Here, the auxiliary capacitance lines 3/23 are made from the same layer as that of the scanning lines 2 (some of the scanning lines 2, i.e. the adjacent scanning lines 2b, may serve as the auxiliary capacitance lines 3/23), and since the drain lines 13a/33a are formed by extension of the drain electrodes 13, the thickness of the gate insulating film 4 may b e se t independently of the insulating layer.

Accordingly, the auxiliary capacitance value can be increased while reducing the signal line capacitance value. Consequently, fluctuations in potential of the pixel electrode 7 can be suppressed, thus enabling stable display or capture of images. Further, since the auxiliary capacitance value can be increased by making the gate insulating film 4 thinner, the width of the auxiliary capacitance lines 3/23 can be decreased, thereby increasing the aperture ratio in a transmittive display device. In other words, it is possible to secure both auxiliary capacitance value and aperture ratio simultaneously.

As a result, it is possible to provide a highly reliable active matrix substrate having high image quality.

An active matrix substrate according to the present embodiment may include signal lines 6 and scanning lines 2 which are both connected to TFTs 10, in which the signal lines 6 and the scanning lines 2 are separated by a resin material.

With this structure, the capacitance value of electrostatic capacitance arising between the signal lines 6 and scanning lines 2 can be reduced, thus reducing the signal line capacitance value.

Incidentally, in an active matrix substrate provided with the auxiliary capacitances 12/32, the resin material is also preferably provided between the auxiliary capacitance lines 3/23, which form the auxiliary capacitances 12/32, and the signal lines 6. With this structure, the signal line capacitance can be further reduced.

A method of manufacturing an active matrix substrate according to the present embodiment includes the steps of forming the scanning lines 2 and the auxiliary capacitance lines 3/23 by patterning of a single film; forming the source and drain electrodes 11 and 13 by patterning of a single film; and forming the pixel electrodes 7 and the signal lines 6 by patterning of a single film.

In this method, the scanning lines 2 and auxiliary capacitance lines 3/23; the source and drain electrodes 11 and 13; and the signal lines 6 and pixel electrodes 7 are respectively formed by patterning of single films. Accordingly, an active matrix substrate can be manufactured without increasing the complexity or number of steps of a conventional method of manufacturing an active matrix substrate having an inter-layer insulating film.

As discussed above, an active matrix substrate according to the present embodiment includes a layer (first electrode layer) forming the scanning lines 2 (the gate electrodes 5), a layer (second electrode layer) forming the source electrodes 11, and a layer forming the signal lines 6, provided in that order on the glass substrate 1; and is provided with an insulating layer (protective film 8, inter-layer insulating film 9, etc.) between the layer forming the source electrodes 11 and the layer forming the signal lines 6: Further, the scanning lines 2 (first lines) and the signal lines 6 (second lines) are provided on opposite sides of the insulating layer.

In addition, it is preferable if gate electrodes 5 are formed on the layer forming the scanning lines 2, if drain electrodes 13 are made from the same layer as that of the source electrodes 11, and if a semiconductor domain 14 of the TFT 10 is provided between the gate electrodes 5 on the one hand and the source and drain electrodes 11 and 13 on the other, in contact with the source and drain electrodes 11 and 13.

In contrast to the conventional structure in which an insulating layer was provided between the gate electrode on the one hand and the source and drain electrodes on the other, the foregoing structure ensures contact between the semiconductor domain 14 and the source and drain electrodes 11 and 13, thus forming a highly reliable TFT 10.

Further, it is preferable if a first insulating film (gate insulating film 4, oxidation film 2a, etc.) is provided between the semiconductor domain 14 and the layer forming the scanning lines 2 and the gate electrodes 5, and if the scanning lines 2 and the signal lines 6 are also separated by the first insulating film.

With this structure, the first insulating film can further reduce the capacitance value of the signal line capacitance arising between the signal lines 6 and the scanning lines 2.

Further, it is preferable if an auxiliary capacitance 12/32 connected to the drain electrode 13 is formed between the insulating layer and the glass substrate 1, and if an auxiliary capacitance line 3/23, which forms one of the electrodes of the auxiliary capacitance 12/32, is separated from the signal lines 6 by the insulating layer.

In this structure, the auxiliary capacitance 12/32 is provided between the insulating layer and the glass substrate 1, and the auxiliary capacitance line 3/23 (which, along with the drain electrode 13, forms the auxiliary capacitance 12/32) is separated from the signal lines 6 by the insulating layer.

In a conventional active matrix substrate, signal lines and auxiliary capacitance lines were separated by a gate insulating film provided on the auxiliary capacitance lines.

In the present structure, in contrast, the signal lines 6 are separated from both the scanning lines 2 and the auxiliary capacitance lines 3/23 by the. insulating layer. Accordingly, the foregoing capacitance value reducing effect applies to signal line capacitance attributable to both the scanning lines 2 and the auxiliary capacitance lines 3/23. As a result, it is possible to greatly reduce the signal line capacitance value.

Incidentally, the auxiliary capacitance lines 3/23 are preferably made of the same layer as that of the scanning lines 2. In this case, by merely modifying the pattern used for patterning of the scanning lines 2, the auxiliary capacitance lines 3/23 can also be formed.

Further, it is also preferable if a second insulating film (gate insulating film 4, oxidation film 3a, etc.) is provided between the layer forming the drain electrodes 13 and the layer forming the auxiliary capacitance lines 3/23, and if the second insulating film also separates the auxiliary capacitance lines 3/23 and the signal lines 6.

With this structure, the second insulating film can reduce the capacitance value of the signal line capacitance arising between the signal lines 6 and the auxiliary capacitance lines 3/23.

In addition, the pixel electrodes 7 connected to the drain electrodes 13 are preferably made of the same layer as that of the layer forming the signal lines 6.

With this structure, since the signal lines 6 and the pixel electrodes 7 are made from the same layer, great increase of the number of manufacturing steps can be avoided, even in the foregoing structure in which the signal lines 6 and the source electrodes 11 are formed on different layers.

In other words, the signal lines 6 and the pixel electrodes 7 can be formed in a s ingle process by patterning of a single conductive film made of a single material. Accordingly, the present active matrix substrate can be manufactured by merely modifying part of the pattern of a patterning mask used in forming the pixel electrodes in a method of manufacturing a conventional active matrix substrate.

A s a result, the foregoing active matrix substrate can be manufactured with fewer manufacturing steps, thus contributing to improvement in yield and reduction of costs.

Further, the foregoing insulating layer preferably includes an inter-layer insulating film 9 made of a resin material.

With this structure, the signal lines 6 are separated from the scanning lines 2 or the auxiliary capacitance lines 3/23 by the inter-layer insulating film 9 made of a resin material. A comparatively thick film of resin material, around 1 $\mu$m to 5 $\mu$m in thickness, can be easily formed by spin coating. Further, since resin generally has a smaller relative dielectric constant than inorganic materials, the inter-layer insulating film 9 can be formed of a material with a small relative dielectric constant.

Accordingly, by using an inter-layer insulating film 9 made of resin in the insulating layer, it is possible to form an insulating layer having a smaller capacitance value than an insulating layer made only of inorganic materials. As a result, the signal line capacitance value can be greatly reduced.

Further, by using a film formation method such as spin coating, unevenness in surface height where the TFTs 10, signal lines 6, etc. can be smoothed out. As a result, when manufacturing a flat-panel image sensor by forming a photoelectric conversion layer of e.g. a-Se on the active matrix substrate, smoothing of the surface of the active matrix substrate can prevent crystallization of the a-Se, thus avoiding impairment of the performance of the photoelectric conversion layer.

In addition, the insulating layer preferably also includes the protective film 8.

In this structure, in addition to the inter-layer insulating film 9, the insulating layer also includes the protective film 8 for protecting the TFTs 10. A protective film 8 for protecting the TFTs 10 can be formed of a stable organic material, for example. By this means, the TFTs 10 can be protected with more certainty, thereby avoiding damage thereto.

Moreover, since the protective film 8 is formed as (part of) the insulating layer, the signal lines 6 are also separated from the scanning lines 2 and the auxiliary capacitance lines 3/23 by the protective layer 8 as well as the gate insulating film 4, the inter-layer insulating film 9, etc. Accordingly, the signal line capacitance value can be further reduced.

Further, the inter-layer insulating film 9 is preferably made of a resin material having photosensitivity. With this structure, the inter-layer insulating film 9 can be easily patterned by steps such as exposure and developing.

Further, the inter-layer insulating film 9 is preferably made of an acrylic resin. Acrylic resin has a relative dielectric constant of approximately 3, which is lower than that of other resins like polyimide, and thus an inter-layer insulating film 9 with a small electrostatic capacitance value can be formed. Accordingly, the signal line capacitance value can be greatly reduced.

In structures where the pixel electrode 7 overlaps with the signal line 6 or the scanning line 2, in particular, the capacitance value of an electrostatic capacitance arising between the pixel electrode 7 and the signal line 6 or scanning line 2 can be greatly reduced by means of the inter-layer insulating film 9.

An active matrix substrate according to the present embodiment includes signal lines 6 and scanning lines 2 connected to TFTs 10, in which the signal lines 6 and the scanning lines 2 are separated by a resin material.

With this structure, the scanning lines 6 and the signal lines 2 are provided on opposite sides of the resin material from each other, extending, for example, in intersecting directions. Since, as discussed above, resin materials have a low relative dielectric constant, the capacitance value of an electrostatic capacitance arising between the signal lines 6 and the scanning lines 2 can be reduced. As a result, the signal line capacitance value can be reduced.

Second Embodiment

Figure 12:
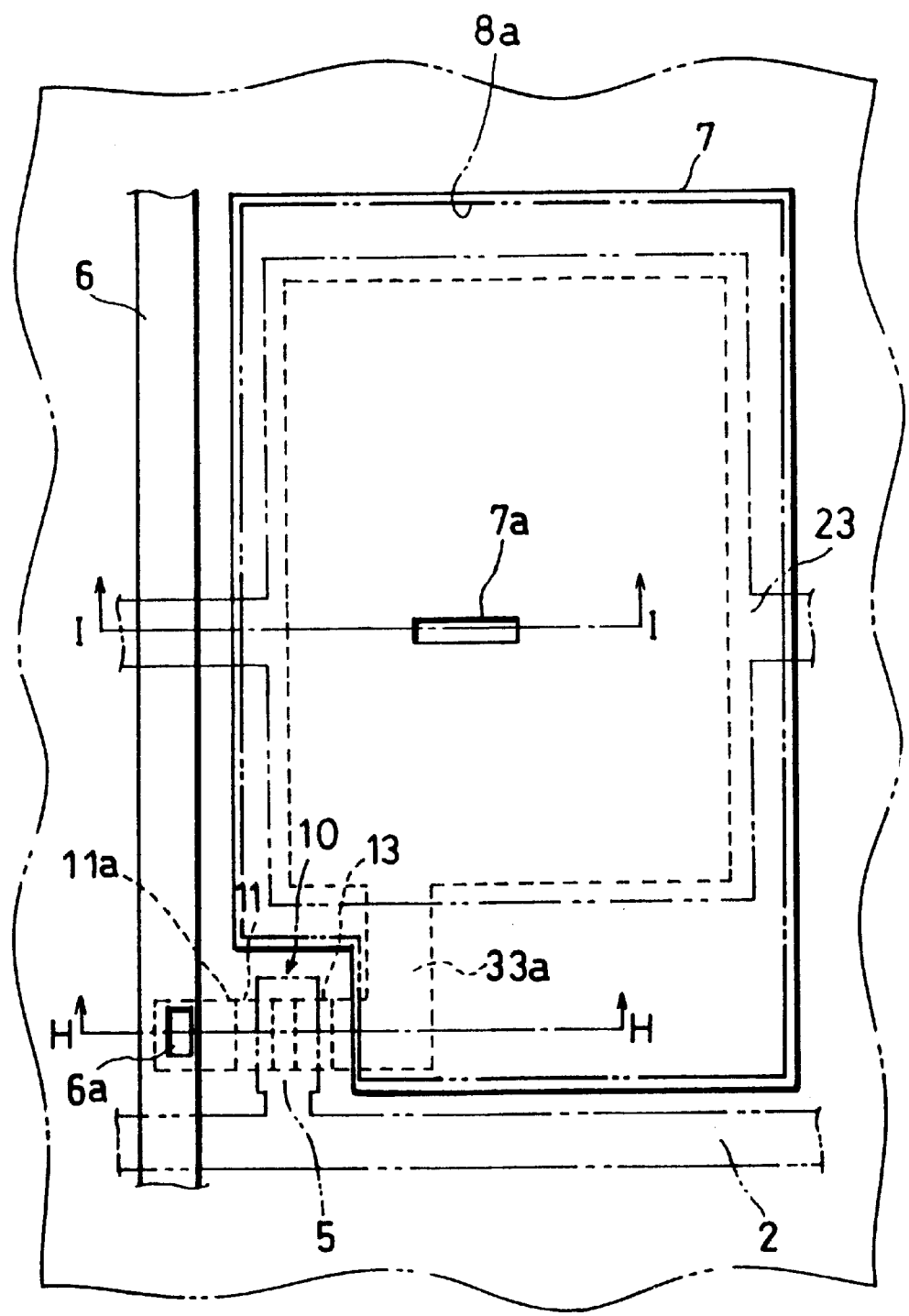
FIG. 12 is a plan view of an active matrix substrate according to a second embodiment of the present invention.
Figure 13:
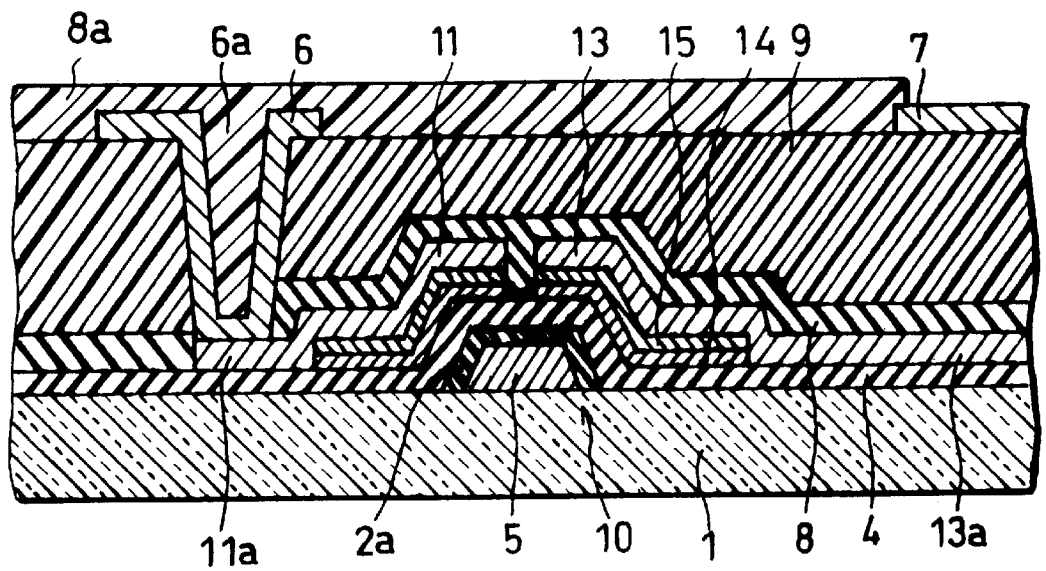
FIG. 13 is a cross-sectional view taken at line H—H of FIG. 12.
Figure 14:
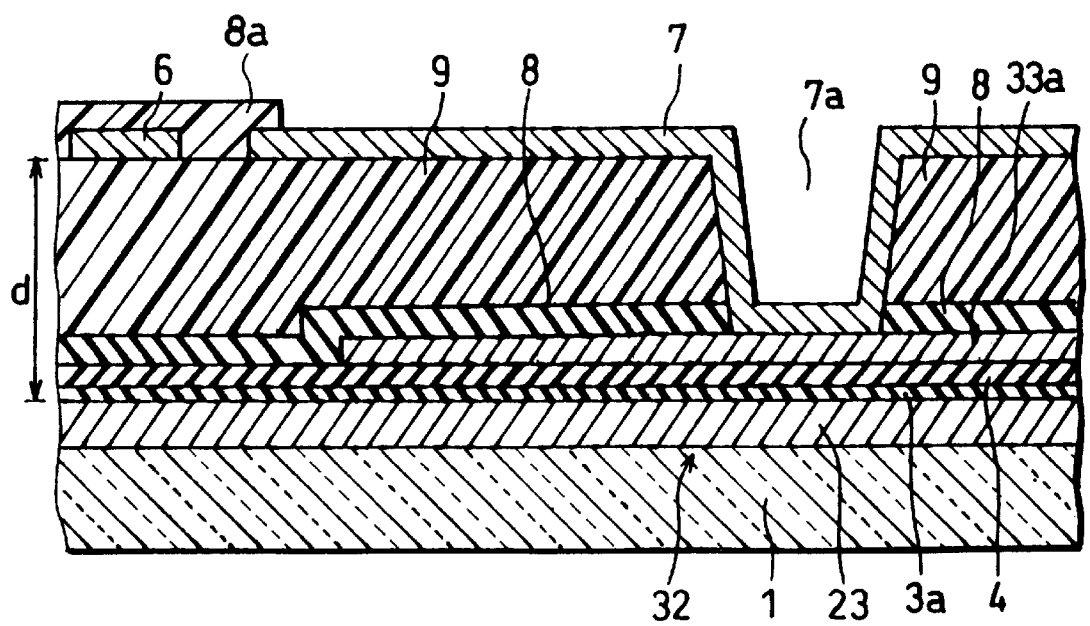
FIG. 14 is a cross-sectional view taken at line I—I of FIG. 12.

The following second embodiment will explain, with reference to FIGS. 12 through 14, another active matrix substrate according to the present invention, resulting from application of the structure of the active matrix substrate explained in the first embodiment above. Members having the same functions as those shown in the drawings pertaining to the first embodiment above will be given the same reference symbols, and explanation thereof will be omitted here.

FIG. 12 is a plan view of an active matrix substrate according to the present embodiment, and FIGS. 13 and 14 are cross-sectional views taken at lines H—H and I—I, respectively, of FIG. 12.

The structure of the active matrix substrate according to the present embodiment is for the most part equivalent to that explained in the first embodiment above with reference to FIG. 9, except for the addition of a second protective film 8a (signal line protective film). In FIG. 12, the second protective layer 8a is shown by a thick two-dot-and-dash line.

The second protective film 8a is provided chiefly so as to cover the signal line 6 which is exposed above the inter-layer insulating film 9. Here, the second protective film 8a is provided so as to cover all areas excluding the pixel electrode 7 (although it overlaps somewhat with the edge of the pixel electrode 7). The second protective film 8a can be made of any insulative material; here, the second protective film 8a is made of resin.

In order to form the second protective film 8a, it is sufficient to add the following step to the manufacturing process explained in the first embodiment above. Namely, in the foregoing manufacturing process, after forming the signal lines 6 and the pixel electrodes 7, an insulative, photosensitive resin is coated onto the active matrix substrate. Then, by exposure and developing, the resin is patterned into a predetermined shape. Here, the shape of patterning is one which, as mentioned above, covers the signal lines 6 but exposes the pixel electrodes 7.

Here, it is preferable to form the second protective film 8a of the same material as the inter-layer insulating film 9, with a thickness of 1 $\mu$m to 3 $\mu$m.

Incidentally, the second protective film 8a is not limited to the foregoing; it is sufficient if it is an insulative protective film which covers the signal line 6. For example, the second protective film 8a may be an oxidation layer obtained by anodic oxidation of the signal line 6 itself.

An active matrix substrate according to the present embodiment, provided, as explained above, with an insulative second protective film 8a covering the signal lines 6, has the following features in addition to the effects explained in the first embodiment above.

Since the signal lines 6 are covered by the insulative second protective film 8a, the present active matrix substrate is advantageous when used in a flat-panel image sensor having a photoelectric conversion layer (sensor material) provided directly on the active matrix substrate. Specifically, by using the present active matrix substrate, the second protective film 8a prevents electrical contact between the signal lines 6 and the photoelectric conversion layer, and thus the charges generated in the photoelectric conversion layer by absorption of visible light, X-rays, etc. can be prevented from being superimposed on the signal lines 6.

Further, since the second protective film 8a covers the signal lines 6, the signal lines 6 are not exposed, thus preventing corrosion thereof.

Incidentally, the active matrix substrate according to the present embodiment, like that of the first embodiment above, may have the so-called Cs-on-gate structure, in which the auxiliary capacitance 12 is formed using the adjacent scanning line 2b (see FIGS. 4 and 5). Further, the present active matrix substrate is widely applicable in active matrix display devices such as a liquid crystal display device, and in flat-panel image sensors such as a flat-panel X-ray image sensor.

As discussed above, an active matrix substrate according to the present embodiment preferably includes a signal line protective film 8a covering the signal lines 6.

With this structure, the signal lines 6 provided on the inter-layer insulating film 9 are covered by the signal line protective film 8a. Accordingly, the signal line protective film 8a prevents exposure of the signal lines 6, thereby preventing corrosion thereof.

Moreover, when manufacturing a flat-panel image sensor having a photoelectric conversion layer (sensor material) provided directly on the active matrix substrate, the signal line protective film 8a prevents electrical contact between the signal lines 6 and the photoelectric conversion layer. Consequently, the charges generated in the photoelectric conversion layer by absorption of visible light, X-rays, etc. can be prevented from being superimposed on the signal lines 6 as noise.

As a result, it is possible to provide an active matrix substrate having highly reliable signal lines 6, in which noise is unlikely to be superimposed on the signal lines 6.

Further, uneven surface height due to provision of the signal lines 6 on the insulating layer can be smoothed by the signal line protective film 8*a*. Accordingly, the incidence of surface unevenness in the active matrix substrate can be reduced.

As a result, when manufacturing a flat-panel image sensor by providing a photoelectric conversion layer of a-Se, etc. on the active matrix substrate, crystallization of the a-Se due to surface unevenness can be prevented, thus avoiding impairment of the performance of the photoelectric conversion layer.

Third Embodiment

Figure 15:
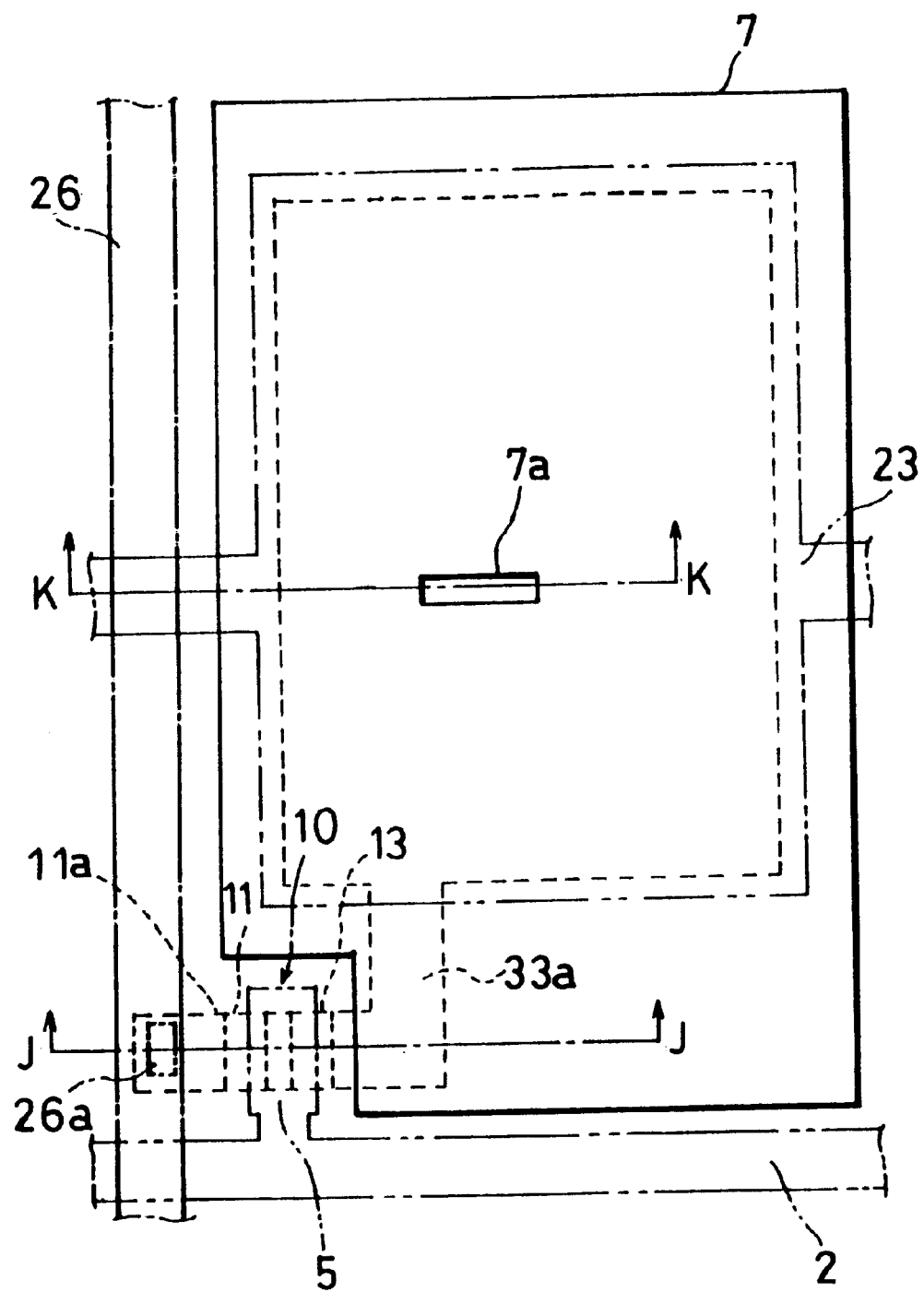
FIG. 15 is a plan view of an active matrix substrate according to a third embodiment of the present invention.
Figure 16:
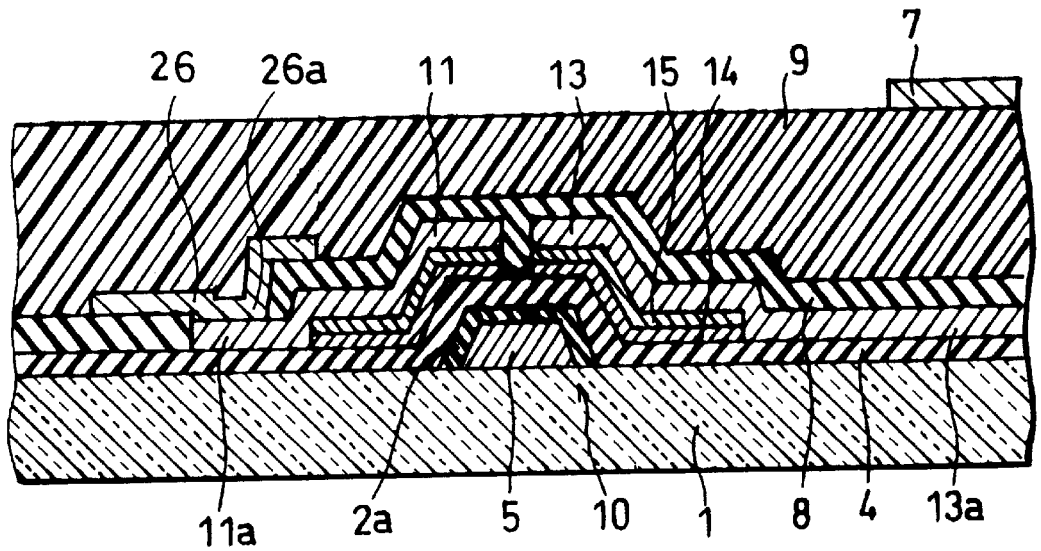
FIG. 16 is a cross-sectional view taken at line J—J of FIG. 15.
Figure 17:
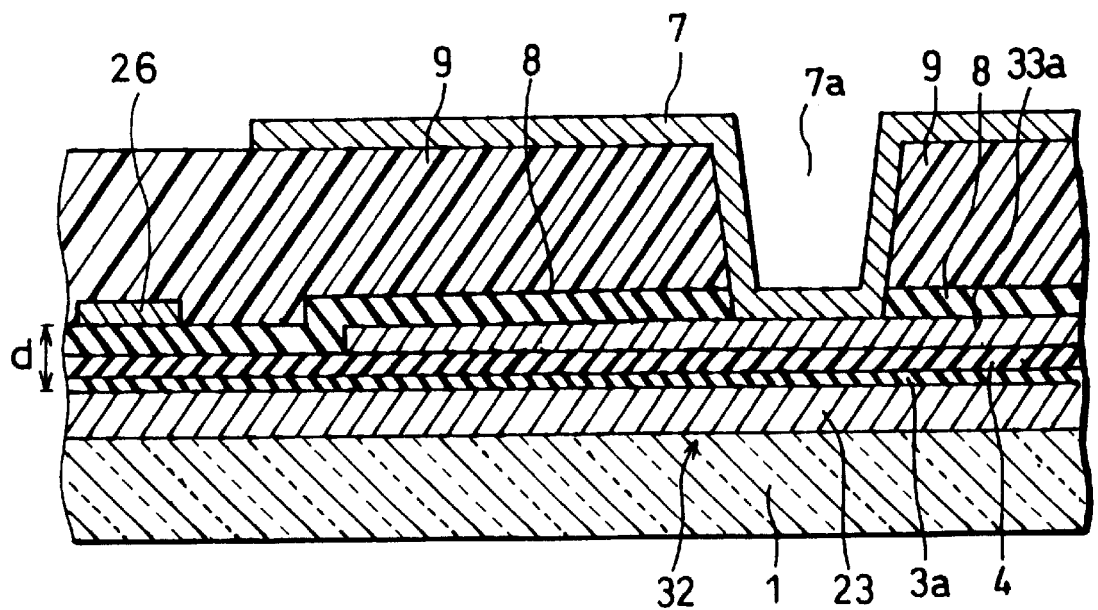
FIG. 17 is a cross-sectional view taken at line K—K of FIG. 15.

The following third embodiment will explain, with reference to FIGS. 15 through 17, another active matrix substrate according to the present invention, structured differently from the active matrix substrate explained in the first embodiment above. Members having the same functions as those shown in the drawings pertaining to the first and second embodiments above will be given the same reference symbols, and explanation thereof will be omitted here.

FIG. 15 is a plan view of an active matrix substrate according to the present embodiment, and FIGS. 16 and 17 are cross-sectional views taken at lines J—J and K—K, respectively, of FIG. 15.

The present active matrix substrate is structured as the active matrix substrate discussed in the first embodiment above with reference to FIG. 9, except for the position of the signal lines.

Specifically, in the active matrix substrate of the first embodiment above (see FIGS. 9–11), signal lines 6 were provided on the upper surface of the inter-layer insulating film 9, but in the active matrix substrate according to the present embodiment, signal lines 26 are provided between the protective film 8 and the inter-layer insulating film 9. Accordingly, the signal lines 26 are connected to the source lines 11*a* via contact holes 26*a* formed in the protective layer 8.

The present active matrix substrate can be manufactured by modifying part of the active matrix substrate manufacturing method explained in the first embodiment, as follows.

In a method of manufacturing the active matrix substrate according to the present embodiment, manufacturing steps up to forming the protective layer 8 and forming therein the contact holes 26*a* (6*a* in the first embodiment) and the contact holes 7*a* are performed in the same manner as in the active matrix substrate manufacturing method of the first embodiment.

Next, before forming the inter-layer insulating film 9 on the protective film 8, the signal lines 26 are formed. As in the first embodiment above, the signal lines 26 may be formed by depositing a film of ITO, tantalum, or aluminum, etc. by sputtering and by patterning the film in a predetermined shape.

Then, on the active matrix substrate provided with the protective film 8 and the signal lines 26, the inter-layer insulating film 9 and the pixel electrodes 7 are formed in the same manner as in the first embodiment, thus completing the active matrix substrate. Naturally, the signal lines 26 do not require formation of the contact holes 6*a* (see FIG. 10) in the inter-layer insulating film 9.

The active matrix substrate according to the present embodiment, structured as described above, has the effect of reducing electrostatic capacitance value, like those of the first and second embodiments above. The following will show that in the present active matrix substrate, the signal line capacitance value is reduced in comparison with a conventional active matrix substrate. The following will consider an electrostatic capacitance value between the signal line 26 on the one hand and the scanning line 2 and auxiliary capacitance line 23 on the other, which accounts for most of the signal line capacitance value.

In a typical example, the oxidation films 2*a* and 3*a* have a thickness of 0.15 $\mu$m and a relative dielectric constant of 24, the gate insulating film 4 a thickness of 0.35 $\mu$m and a relative dielectric constant of 6.9, and the protective film 8 a thickness of 0.5 $\mu$m and a relative dielectric constant of 6.9, and these values are equivalent in the conventional active matrix substrate (see FIGS. 6–8) and that according to the present embodiment.

In the conventional active matrix substrate, the signal line 56 and the scanning line 52 or auxiliary capacitance line 53 were separated only by the gate insulating film 54 and the oxidation layers 52*a* or 53*a* (see FIGS. 7 and 8), but in the present embodiment, the signal line 26 and the scanning line 2 or the auxiliary capacitance line 23 are separated by the gate insulating film 4, the oxidation layers 2*a* or 3*a*, and the protective layer 8.

Calculation of the electrostatic capacitance value for 1 $\mu$m$^2$ of overlap with the signal line 26 yielded a result of 0.16 fF/$\mu$m$^2$ for the conventional active matrix substrate, and 0.068 fF/$\mu$m$^2$ for the present embodiment. In the present embodiment, providing the signal line 26 on the protective film 8 increases an interval d between the signal line 26 and the scanning line 2 or the auxiliary capacitance line 23 to approximately 1 $\mu$m. As a result, the value of electrostatic capacitance parasitic on the signal line 26 is reduced to 1/2.4 of that in the conventional art.

This rate of reduction is less than the reduction rate of approximately 1/20 obtained in the active matrix substrate according to the first embodiment above. However, it is still effective in reducing noise generated in the signal line 26 due to the small signal line capacitance value in the conventional active matrix substrate.

In addition to the foregoing effect of reducing electrostatic capacitance value, the present active matrix substrate also has the structural advantage of a low incidence of difference (unevenness) in surface height (surface unevenness) of the active matrix substrate, or a low value of surface height difference. The following will explain this in concrete terms.

In the active matrix substrate explained in the first embodiment above (see e.g. FIGS. 10 and 11), the signal lines 6 and the pixel electrodes 7 were exposed on the inter-layer insulating film 9.

Since, as discussed above, the inter-layer insulating film 9 is formed by, for example, a coating of photosensitive resin, all unevennesses beneath the inter-layer insulating film 9 are eliminated or lessened by the inter-layer insulating film 9. Accordingly, surface unevenness of the active matrix substrate are an unevenness corresponding to the film thickness of the signal lines 6 and the pixel electrodes 7 (film thickness difference), and the depth of the contact holes 6*a* and 7*a*.

Since the signal lines 6, the pixel electrodes 7, and the contact holes 6*a* and 7*a* are provided in each pixel, the foregoing surface unevennesses are present in each pixel of the active matrix substrate according to the first embodiment above. Consequently, in the active matrix substrate of the first embodiment, incidence of surface unevenness, i.e. the number of differences in surface height occurring per unit surface area, is comparatively high.

In contrast, in the active matrix substrate explained in the second embodiment above (see FIGS. 13 and 14), the signal lines 6 and contact holes 6a are covered by the second protective film 8a. Accordingly, surface unevenness of the active matrix substrate are only the film thickness difference of the second protective film 8a, and the depth of the contact hole 7a. For that reason, the rate of incidence of surface unevenness is reduced in comparison with the first embodiment.

However, as discussed above, the second protective film 8a is formed by, for example, a coating of photosensitive resin, and thus the film thickness unevenness of the second protective film 8a may be on the micrometer order.

In contrast, in the active matrix substrate according to the present embodiment (see FIGS. 16 and 17), the signal lines 26 are provided beneath the inter-layer insulating film 9, and only the pixel electrodes 7 are exposed on the inter-layer insulating film 9. Accordingly, the surface unevenness of the present active matrix substrate are only the film thickness difference of the pixel electrode 7, and the depth of the contact hole 7a. For this reason, in the active matrix substrate of the present embodiment, the rate of incidence of surface unevenness is reduced in comparison with that of the first embodiment.

Furthermore, since the pixel electrodes 7 are formed of a thin film of ITO or metal (with a thickness of 0.1 $\mu$m–0.3 $\mu$m, for example), the film thickness difference of the pixel electrodes 7 is much smaller than that of the second protective layer 8a of the second embodiment. For that reason, in the active matrix substrate of the present embodiment, the surface unevenness value can be reduced in comparison with that of the second embodiment.

When using an active matrix substrate in a flat-panel image sensor, particularly one which uses a typical photoelectric conversion layer of a-Se, it is necessary to make surface unevennesses of the active matrix substrate as small and as few as possible, i.e., to reduce as much as possible the value and rate of incidence of surface unevenness (see FIG. 20, to be discussed below).

This is because when, for example, a film of a-Se is formed directly on the active matrix substrate, surface unevennesses thereof become singularities which trigger crystallization of the a-Se. If the a-Se crystallizes, dark current of the photoelectric conversion layer is increased, and photoelectric conversion characteristics are markedly impaired.

Accordingly, the active matrix substrate of the present embodiment, having small surface irregularities and a small rate of incidence thereof, is suited to a flat-panel image sensor. Further, by using the present active matrix substrate in a flat-panel image sensor, it is possible to suppress crystallization of the photoelectric conversion layer made of e.g. a-Se, and thus to prevent impairment of photoelectric conversion characteristics.

Incidentally, the active matrix substrate according to the present embodiment, like that of the first embodiment above, may have the so-called Cs-on-gate structure, in which the auxiliary capacitance 12 is formed using the adjacent scanning line 2b (see FIGS. 4 and 5). Further, the present active matrix substrate is widely applicable in active matrix display devices such as a liquid crystal display device, and in flat-panel image sensors such as a flat-panel X-ray image sensor.

Further, since the signal lines 26 and the pixel electrodes 7 are separated by the inter-layer insulating film 9, it is also possible to structure the present active matrix such that the pixel electrodes 7 overlap with the signal lines 26. With this structure, the surface area of the pixel electrodes 7 can be increased, thus improving aperture rate.

As discussed above, in the active matrix substrate according to the present embodiment, it is preferable if the foregoing insulating layer is made of the protective layer 8 for protecting the TFTs 10, and if the signal lines 26 and protective layer 8 are covered by the inter-layer insulating film 9.

In this structure, the signal lines 26 are separated from the scanning lines 2 and the auxiliary capacitance lines 23 by the protective film 8 as insulating layer.

In this case, the protective film 8 serves to protect the TFT 10, but is independent therefrom, and thus can be increased in thickness without hindering functioning of the TFT 10. Further, by increasing the thickness of the protective film 8, the signal line capacitance value can be reduced.

Further, with this structure, the protective film 8 (insulating layer) and the signal lines 26 provided on the protective film 8 are covered by the inter-layer insulating film 9. Consequently, differences in height between the protective film 8 and the signal lines 26, and surface unevenness due to the TFTs 10, can be smoothed by the inter-layer insulating film 9. As a result, when manufacturing a flat-panel image sensor by providing a photoelectric conversion layer of e.g. a-Se on the present active matrix substrate, the a-Se can be prevented from crystallizing due to surface unevenness attributable to the signal lines 26, TFTs 10, etc., thus preventing impairment of performance of the photoelectric conversion layer.

Further, the pixel electrodes 7 connected to the drain electrodes 13 are preferably provided on the inter-layer insulating film 9.

In this structure, the signal lines 26 and the pixel electrodes 7 are separated by the inter-layer insulating film 9. Accordingly, the pixel electrodes 7 can be structured so as to overlap with the signal lines 26, thus increasing the surface area of the pixel electrodes 7 and improving aperture ratio.

Moreover, the capacitance value of electrostatic capacitance arising between the signal line 26 and the pixel electrode 7 can be reduced by the inter-layer insulating film 9, thus making it possible to further reduce the signal line capacitance value.

Further, the inter-layer insulating film 9 is preferably made of a resin material. A comparatively thick film of resin material, around 1 $\mu$m to 5 $\mu$m in thickness, can be easily formed by spin coating.

Accordingly, surface unevenness arising where the TFTs 10, signal lines 26, etc. are provided can be smoothed. As a result, when manufacturing a flat-panel image sensor by providing a photoelectric conversion layer of e.g. a-Se on the present active matrix substrate, crystallization of the a-Se can be prevented, thus preventing impairment of performance of the photoelectric conversion layer.

Moreover, since resin generally has a smaller relative dielectric constant than inorganic materials, the inter-layer insulating film 9 can be formed of a material with a small relative dielectric constant.

Accordingly, in a structure in which the pixel electrodes 7 overlap with the signal lines 26, by using an inter-layer insulating film 9 having a small relative dielectric constant, it is possible to greatly reduce the capacitance value of an electrostatic capacitance arising between the signal lines 26 and the pixel electrodes 7.

Fourth Embodiment

Figure 18:
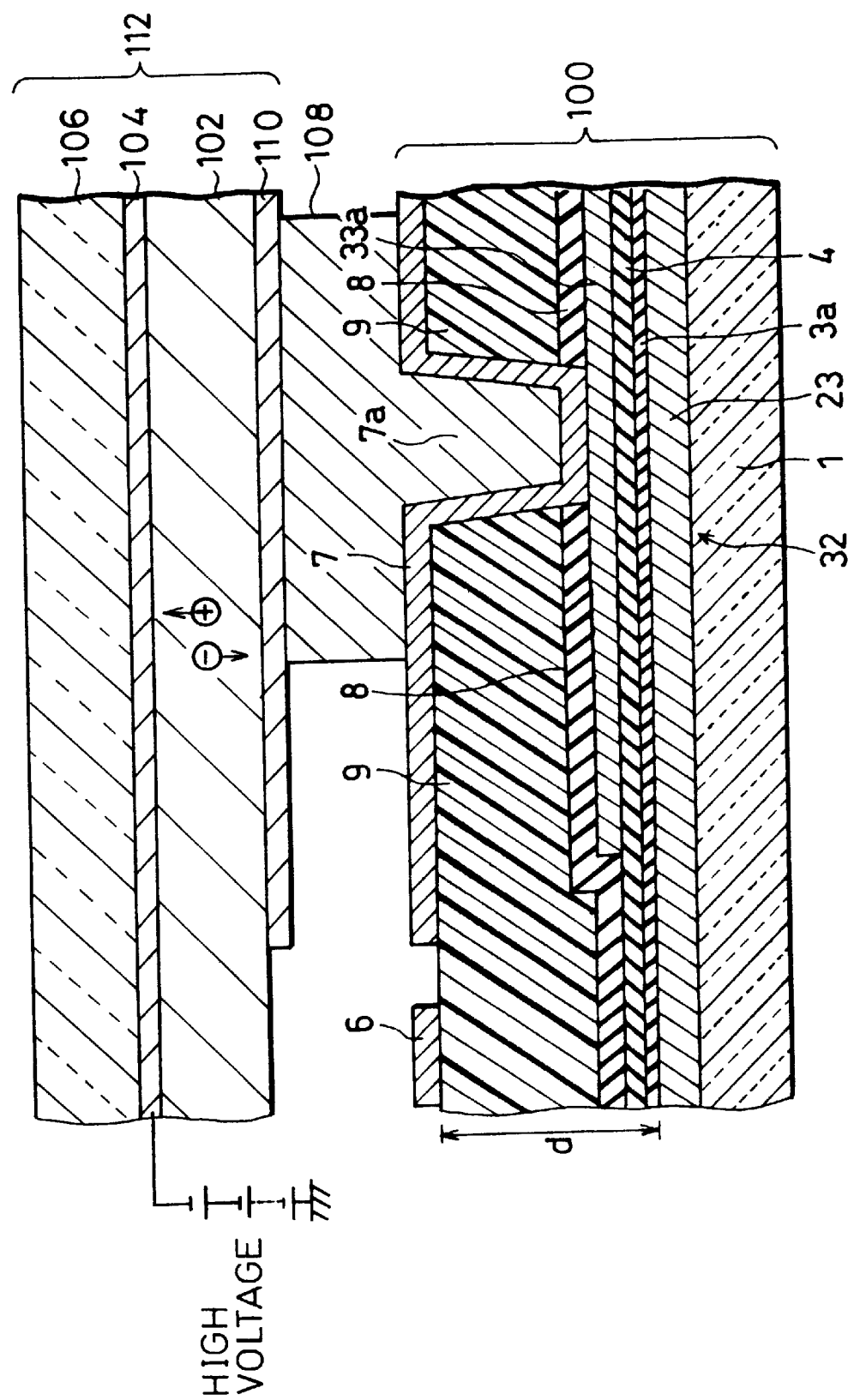
FIG. 18 is a cross-sectional view of a flat-panel X-ray image sensor according to a fourth embodiment of the present invention.

The following fourth embodiment will explain, with reference to FIG. 18, a flat-panel image sensor which uses the active matrix substrate explained in the first embodiment above. Members having the same functions as those shown in the drawings pertaining to the first embodiment above will be given the same reference symbols, and explanation thereof will be omitted here.

As shown in FIG. 18, the flat-panel image sensor according to the present embodiment is a flat-panel X-ray image sensor made up of an active matrix substrate 100, equivalent to that explained in the first embodiment above with reference to FIGS. 9 through 11, and a sensor substrate 112, with a conductive connector material 108 provided therebetween. Since the active matrix substrate 100 provided in the present flat-panel X-ray image sensor is equivalent to the active matrix substrate explained in the first embodiment above with reference to FIGS. 9 through 11, explanation thereof will be omitted here. FIG. 18 is a cross-sectional view of part of the present flat-panel X-ray image sensor corresponding to line G—G of FIG. 9.

First the sensor substrate 112 will be explained. The sensor substrate 112 includes a glass substrate 106, provided with, on a side thereof facing the active matrix substrate 110 (the opposite side from that receiving incident X-rays), a sensor bias electrode 104, a photoelectric conversion layer 102 (sensor film; sensor layer; sensor material), and a charge-collecting electrode 110, in that order.

The photoelectric conversion layer 102 generates positive and negative charges upon reception of X-rays, and is made of CdTe in the present embodiment.

The sensor bias electrode 104 and the charge-collecting electrode 110 are made of films of ITO or metal, and are provided on opposite sides of the photoelectric conversion layer 102 from each other. Further, a high voltage can be applied between the sensor bias electrode 104 and the charge-collecting electrode 110.

Here, when X-rays are incident on the photoelectric conversion layer 102, positive and negative charges are generated therein in accordance with the strength of the incident X-rays. At this time, if a high voltage is applied between the sensor bias electrode 104 and the charge-collecting electrode 110, the electric field generated thereby causes the positive and negative charges to move to the sensor bias electrode 104 or the charge-collecting electrode 110.

For example, FIG. 18 shows a case in which a high voltage is applied so that the charge-collecting electrode 110 is positive with respect to the sensor bias electrode 104. In this case, positive charges move toward the sensor bias electrode 104, and negative charges toward the charge-collecting electrode 110.

Charges which move to and are collected by the charge-collecting electrode 110 in this way are then read out by pixel as image signals by the active matrix substrate 100, thus obtaining a two-dimensional image of the X-rays incident on the flat-panel X-ray image sensor.

Here, in order to read out the charges collected in the charge-collecting electrode 110 by pixel, a charge-collecting electrode 110 is provided independently for each pixel. In this way, crosstalk of signals from adjacent pixels can be avoided. The sensor bias electrode 104 and the photoelectric conversion layer 102, however, can be provided across substantially the entire surface of the glass substrate 106.

The following will explain connection of the foregoing sensor substrate 112 with the active matrix substrate 100. As explained above, the active matrix substrate 100 reads out the charges collected in the charge-collecting electrodes 110 of the sensor substrate 112 as image signals through the TFTs 10 (see FIG. 9) provided in each pixel. Accordingly, a conductive connector material 108 is provided in each pixel for connecting the charge-collecting electrode 110 of the sensor substrate 112 to the pixel electrode 7 of the active matrix substrate 110.

The conductive connector material 108 may be a photosensitive resin which has been given conductivity, solder or a conductive adhesive which can be patterned, etc. By using one of these materials, it is possible to form a conductive connector material 108 patterned independently for each pixel electrode 7.

Here, a flat-panel X-ray image sensor with approximately 2800×2800 pixels and a pixel pitch of 0.15 mm was prepared with the foregoing structure, and an X-ray image was captured. As a result, it was found that the signal line capacitance reduction effect of the active matrix substrate 100 made it possible to obtain an image signal with an exceptionally good S/N ratio. Capture of moving images was also found to be possible.

The foregoing structure is one which enables manufacture of the flat-panel X-ray image sensor by first forming the active matrix substrate 100 and the sensor substrate 112 separately, and then connecting the active matrix substrate 100 and the sensor substrate 112 together. For this reason, the film formation temperature of the photoelectric conversion layer 102 during forming of the sensor substrate 112 is not limited by the thermal resistance temperature of the active matrix substrate 100. Accordingly, in addition to the foregoing CdTe, it is possible to select from among a variety of materials such as CdZnTe for the photoelectric conversion layer 102.

Further, in the flat-panel X-ray image sensor structured as above, the photoelectric conversion layer 102 is not provided directly on the active matrix substrate. Accordingly, even when using an active matrix substrate with a comparatively high incidence of surface unevenness, unsatisfactory film formation due to surface unevenness of the active matrix substrate can be prevented, thus suppressing impairment of the characteristics of the photoelectric conversion layer 102.

Incidentally, the foregoing explained an X-ray image sensor, in which the photoelectric conversion layer 102 generates charges upon receiving X-rays, but there is no limitation to this. By changing the material forming the photoelectric conversion layer 102, it is possible to structure an image sensor which obtains images of electromagnetic waves of another wavelength domain.

As discussed above, in the flat-panel image sensor according to the present embodiment, the photoelectric conversion layer 102 and the pixel electrodes 7 are preferably connected by a conductive connector material 108 patterned to correspond to the pixel electrodes 7.

A flat-panel image sensor with this structure can be manufactured by first separately forming the active matrix substrate 100 and the substrate including the photoelectric conversion layer 102, and then electrically connecting the two substrates together. For this reason, the film formation temperature of the photoelectric conversion layer 102 during forming of the sensor substrate 112 is not limited by the thermal resistance temperature of the active matrix substrate 100. Accordingly, the material for the photoelectric conversion layer 102 can be selected from among a variety of materials, including materials with comparatively high film formation temperatures, such as CdTe and CdZnTe.

Further, the foregoing flat-panel X-ray image sensor can be structured such that the photoelectric conversion layer 102 is not provided directly on the active matrix substrate 100. Accordingly, even when using an active matrix substrate with a comparatively high incidence of surface unevenness, unsatisfactory film formation due to surface unevenness of the active matrix substrate 100 can be prevented, thus suppressing impairment of the characteristics of the photoelectric conversion layer 102.

Fifth Embodiment

Figure 19:
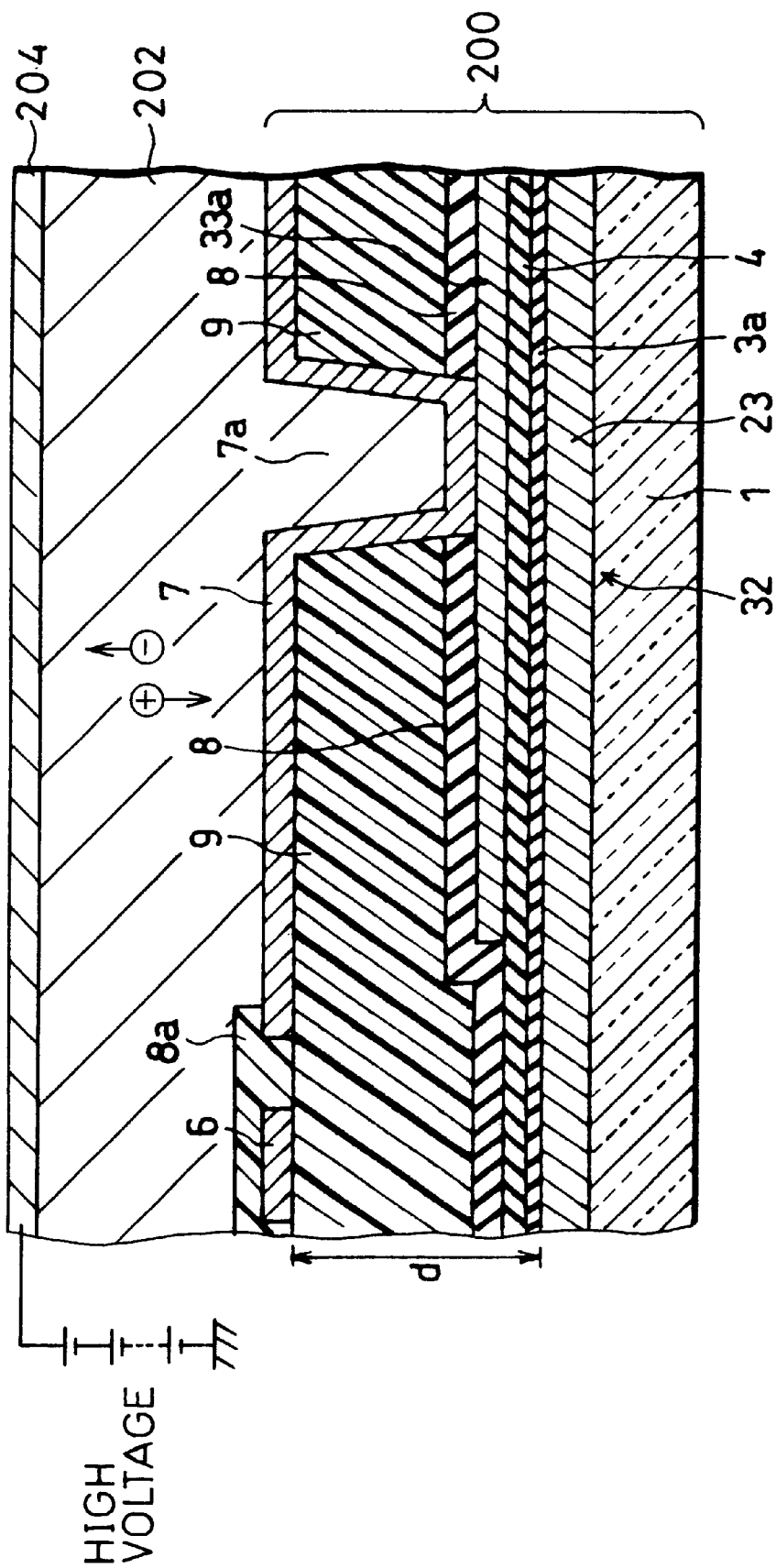
FIG. 19 is a cross-sectional view of a flat-panel X-ray image sensor according to a fifth embodiment of the present invention.

The following fifth embodiment will explain, with reference to FIG. 19, a flat-panel image sensor which uses the active matrix substrate explained in the second embodiment above. Members having the same functions as those shown in the drawings pertaining to the second embodiment above will be given the same reference symbols, and explanation thereof will be omitted here.

As shown in FIG. 19, the flat-panel image sensor according to the present embodiment is a flat-panel X-ray image sensor made up of an active matrix substrate 200, equivalent to that explained in the second embodiment above with reference to FIGS. 12 through 14, a photoelectric conversion layer 202, and a sensor bias electrode 204. Since the active matrix substrate 200 provided in the present flat-panel X-ray image sensor is equivalent to the active matrix substrate explained in the second embodiment above with reference to FIGS. 12 through 14, explanation thereof will be omitted here. FIG. 19 is a cross-sectional view of part of the present flat-panel X-ray image sensor corresponding to line I—I of FIG. 12.

In the present flat-panel X-ray image sensor, the photoelectric conversion layer 202 (sensor film; sensor layer) is provided over substantially the entire surface of the active matrix substrate 200. Further, the sensor bias electrode 204 is provided over substantially the entire surface of the photoelectric conversion layer 202.

Here, the photoelectric conversion layer 202 is made of a material such as a-Se, and the sensor bias electrode 204 of a metal film of e.g. Au (gold).

The present flat-panel X-ray image sensor, like the flat-panel X-ray image sensor of the fourth embodiment above, reads out as image signals charges generated in the photoelectric conversion layer 202 by X-rays incident thereon.

The present flat-panel X-ray image sensor differs from that of the fourth embodiment above in that the photoelectric conversion layer 202 is provided directly on the active matrix substrate 200. For this reason, manufacturing of the flat-panel X-ray image sensor is simplified, and the manufacturing process can be streamlined.

Further, a high voltage is applied between the sensor bias electrode 204 and the pixel electrode 7. By applying this high voltage, charges moving toward the active matrix substrate 200 are collected directly by the pixel electrode 7 (charge-collecting electrode) of the active matrix substrate 200, and read out through the TFT 10 (see FIG. 12).

For example, FIG. 19 shows a case in which a high voltage is applied such that the pixel electrode 7 is negative with respect to the sensor bias electrode 204. In this case, negative charges move toward the sensor bias electrode 204, and positive charges toward the pixel electrode 7.

The present flat-panel X-ray image sensor is structured such that the photoelectric conversion layer 202 made of e.g. a-Se is formed directly on the active matrix substrate 200. However, since the active matrix substrate 200 has a reduced incidence of surface unevenness because of the second protective film 8a, e.g. a-Se of the photoelectric conversion layer 202 can be prevented from crystallizing. Consequently, with the present flat-panel X-ray image sensor, it is possible to suppress increase of dark current in the photoelectric conversion layer 202.

Here, a flat-panel X-ray image sensor with approximately 2800×2800 pixels and a pixel pitch of 0.15 mm was prepared with the foregoing structure, and an X-ray image was captured. As a result, it was found that the effects of the active matrix substrate 200 in reducing signal line capacitance and suppressing increase of dark current made it possible to obtain an image signal with an exceptionally good S/N ratio. Capture of moving images was also found to be possible.

As discussed above, in the flat-panel image sensor according to the present embodiment, the photoelectric conversion layer 202 is provided on the pixel electrode 7, and the pixel electrode 7 functions as a charge-collecting electrode.

With this structure, a flat-panel image sensor with a small signal line capacitance value can be obtained, thus making it possible to suppress increase of the time required for readout of charges caused by signal line capacitance, and to reduce noise applied to the signal of the signal line 6 due to the influence of the scanning lines 2 (see FIG. 12) and the auxiliary capacitance lines 23. As a result, it is possible to provide an image sensor which is able to obtain accurate image data even with images in very weak electromagnetic waves, as for example in medical X-ray imaging.

Furthermore, the present flat-panel X-ray image sensor is structured of the active matrix substrate 200, in which the second protective film 8a reduces the rate of incidence of surface unevenness, and the resulting smoothness can suppress crystallization of the photoelectric conversion layer 202 of e.g. a-Se. This in turn prevents impairment of the performance of the photoelectric conversion layer 202.

Sixth Embodiment

Figure 20:
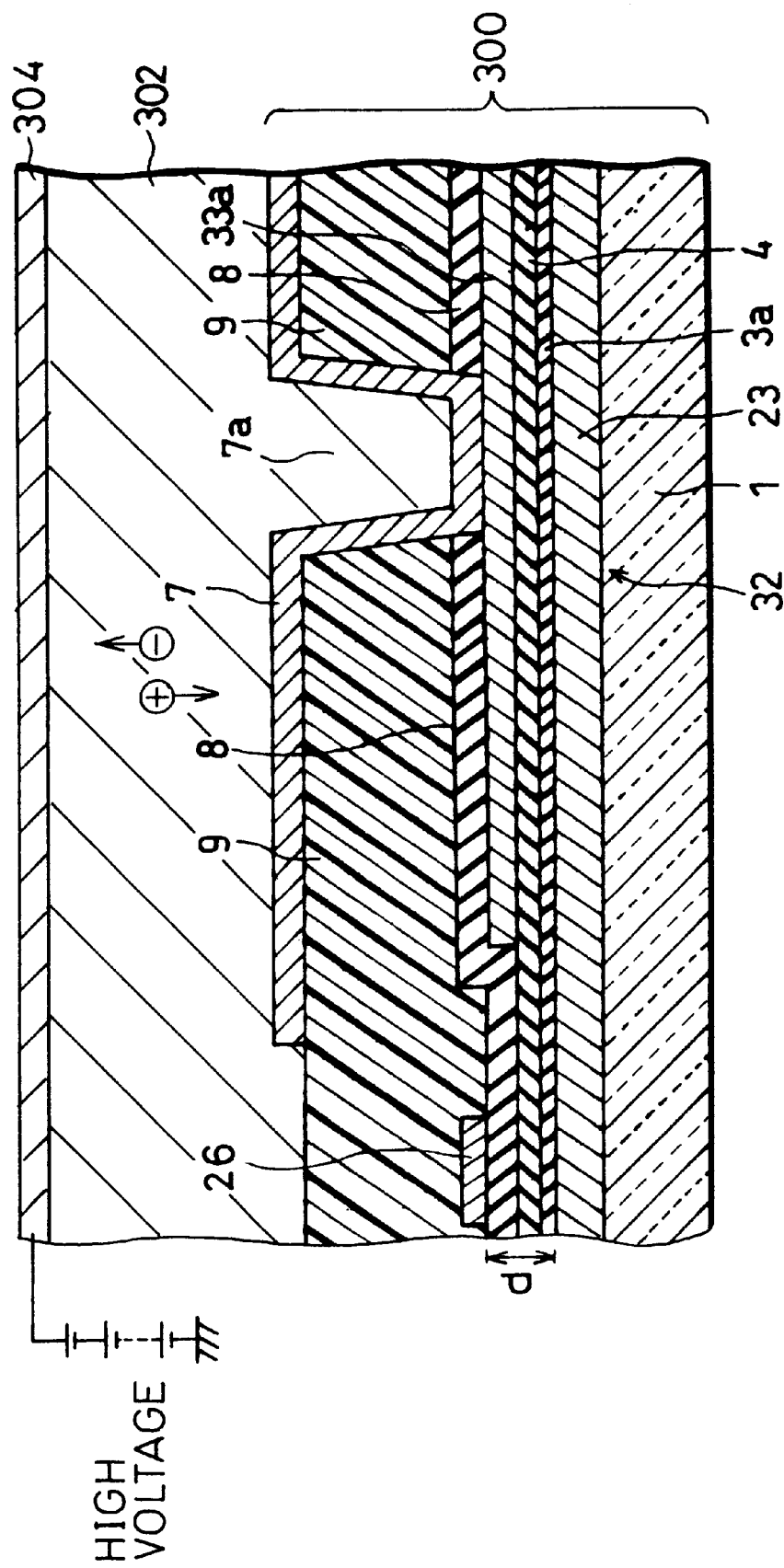
FIG. 20 is a cross-sectional view of a flat-panel X-ray image sensor according to a sixth embodiment of the present invention.

The following sixth embodiment will explain, with reference to FIG. 20, a flat-panel image sensor which uses the active matrix substrate explained in the third embodiment above. Members having the same functions as those shown in the drawings pertaining to the third embodiment above will be given the same reference symbols, and explanation thereof will be omitted here.

As shown in FIG. 20, the flat-panel image sensor according to the present embodiment is a flat-panel X-ray image sensor made up of an active matrix substrate 300, equivalent to that explained in the third embodiment above with reference to FIGS. 15 through 17, a photoelectric conversion layer 302, and a sensor bias electrode 304. Since the active matrix substrate 300 provided in the present flat-panel X-ray image sensor is equivalent to the active matrix substrate explained in the third embodiment above with reference to FIGS. 15 through 17, explanation thereof will be omitted here. FIG. 20 is a cross-sectional view of part of the present flat-panel X-ray image sensor corresponding to line K—K of FIG. 15.

In the present flat-panel X-ray image sensor, the photoelectric conversion layer 302 (sensor film; sensor layer) is provided over substantially the entire surface of the active matrix substrate 300. Further, the sensor bias electrode 304 is provided over substantially the entire surface of the photoelectric conversion layer 302.

Here, the photoelectric conversion layer 302 is made of a material such as a-Se, and the sensor bias electrode 304 of a metal film of e.g. Au (gold).

The structure and functions of the present flat-panel X-ray image sensor are substantially the same as those of the flat-panel X-ray image sensor of the fifth embodiment above. The present flat-panel X-ray image sensor differs from that of the fifth embodiment above in that, in the active matrix substrate 300, the signal lines 26 are provided beneath the inter-layer insulating film 9, and only the pixel electrodes 7 are exposed on the inter-layer insulating film 9. Accordingly, as discussed above, in addition to the rate of incidence of surface unevenness, the value of the difference in height of the surface unevenness can also be reduced in comparison with the fifth embodiment. Consequently, crystallization of the e.g. a-Se of the photoelectric conversion layer 302 can be further suppressed, and it is possible to reduce dark current in the photoelectric conversion layer 302.

Here, a flat-panel X-ray image sensor with approximately 2800×2800 pixels and a pixel pitch of 0.15 mm was prepared with the foregoing structure, and an X-ray image was captured. As a result, it was found that the effects of the active matrix substrate 300 in reducing signal line capacitance and suppressing increase of dark current made it possible to obtain an image signal with an exceptionally good S/N ratio. Capture of moving images was also found to be possible. In addition, it was found that the incidence of faults due to crystallization of the photoelectric conversion layer 302 was exceptionally low.

As discussed above, the present flat-panel X-ray image sensor is structured of the active matrix substrate 300, in which the inter-layer insulating film 9 reduces the rate of incidence of surface unevenness and/or provides a smoother surface, and this smoothness can suppress crystallization of the photoelectric conversion layer 302 of e.g. a-Se. This in turn prevents impairment of the performance of the photoelectric conversion layer 302.

Seventh Embodiment

Each of the active matrix substrates described in the first through third embodiments above used TFTs 10 (see FIGS. 2 and 3) of the bottom-gate type (inverse staggered structure). However, the present invention is not limited to this, and is of course also applicable to TFTs 80 (switching elements) of the top-gate type (staggered structure).

Accordingly, the following seventh embodiment will explain, with reference to FIGS. 21 through 24, an active matrix substrate which uses a top-gate TFT 80. Members having the same functions as those shown in the drawings pertaining to the first through third embodiments above will be given the same reference symbols, and explanation thereof will be omitted here.

Figure 21:
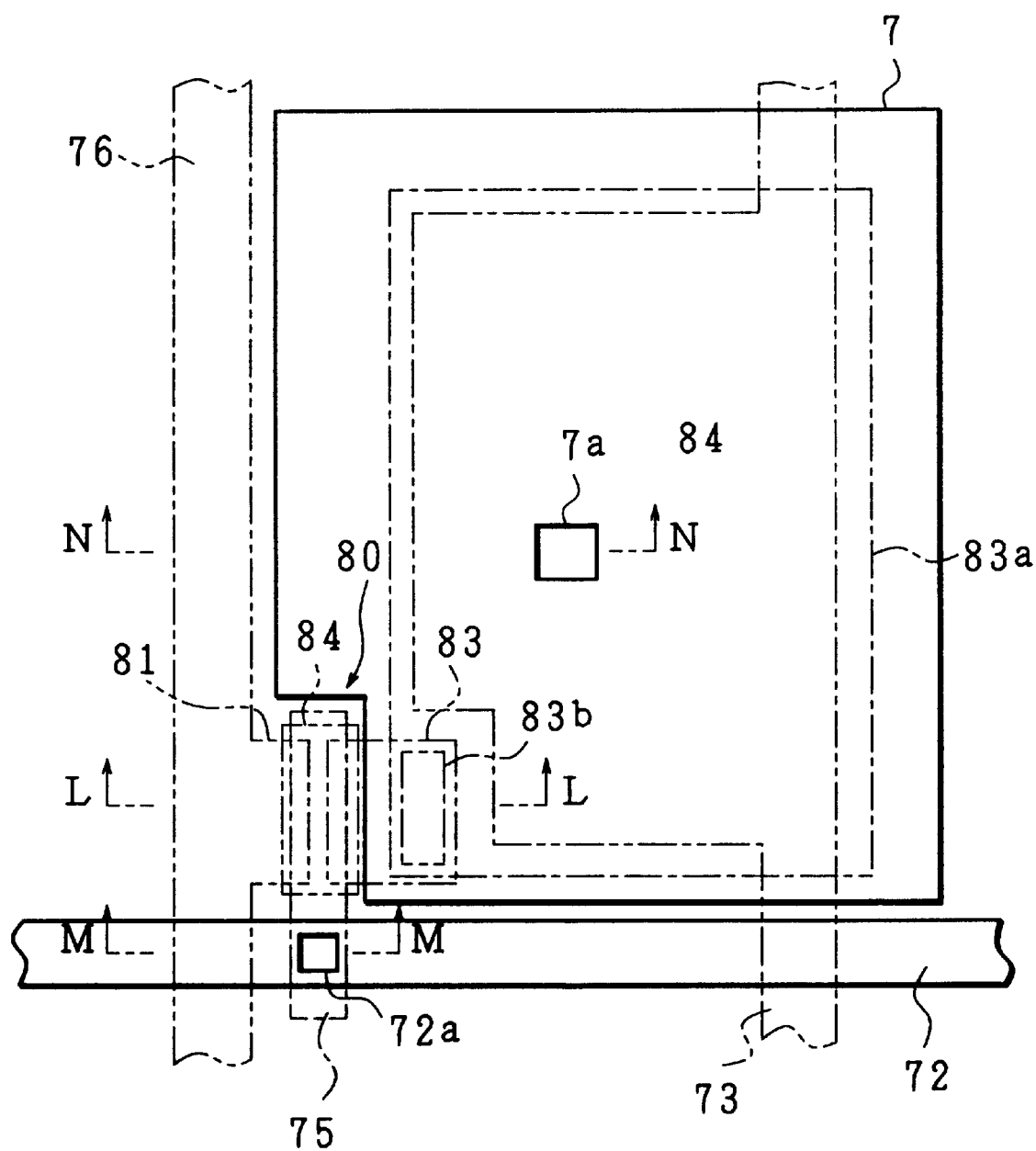
FIG. 21 is a plan view of an active matrix substrate according to a seventh embodiment of the present invention.
Figure 22:
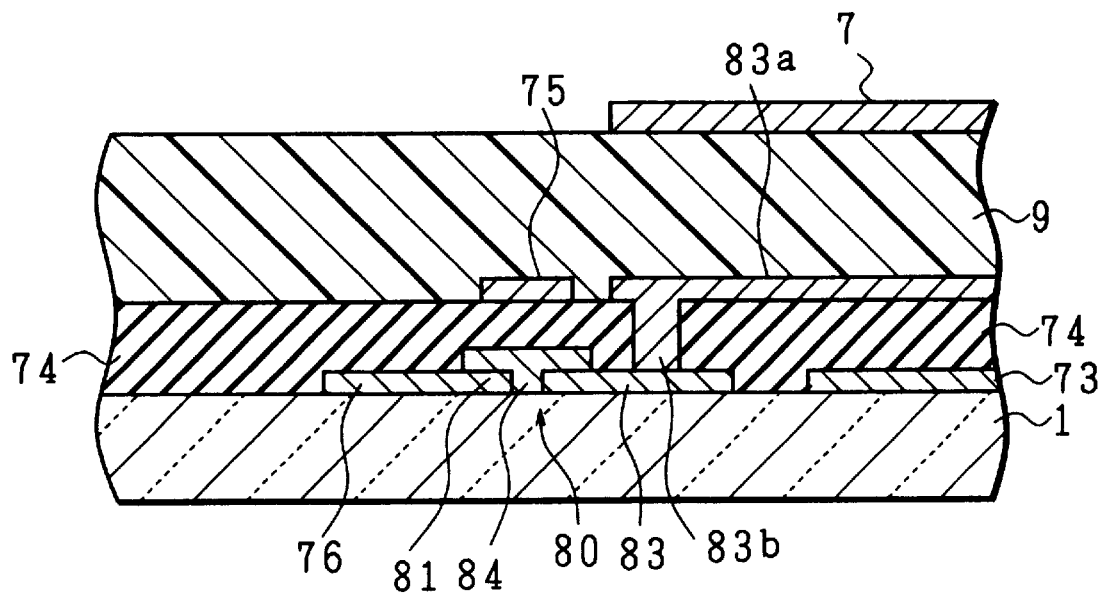
FIG. 22 is a cross-sectional view taken at line L—L of FIG. 21.
Figure 23:
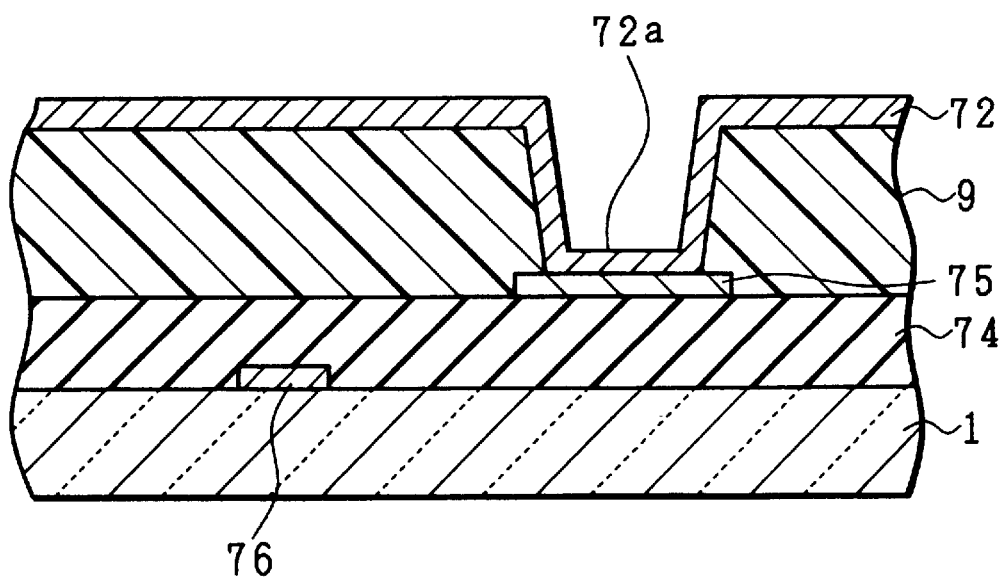
FIG. 23 is a cross-sectional view taken at line M—M of FIG. 21.
Figure 24:
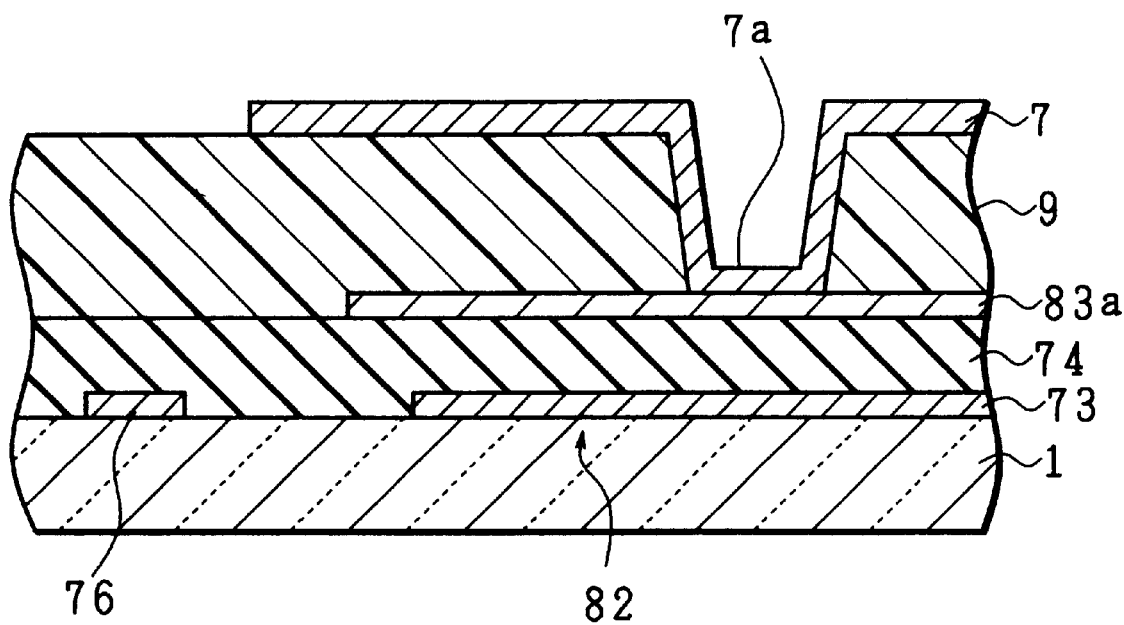
FIG. 24 is a cross-sectional view taken at line N—N of FIG. 21.

FIG. 21 is a plan view of the active matrix substrate according to the present embodiment, and FIGS. 22, 23 and 24 are cross-sectional views taken at lines L—L, M—M and N—N, respectively, of FIG. 21.

The basic difference of the present active matrix substrate from that of the first embodiment above is that the TFTs 80 have a top-gate structure, and that consequently the vertical positions of the scanning lines 72 and signal lines 76 relative to the glass substrate 1 are inverted. This active matrix substrate is structured as follows.

A plurality of scanning lines 72 and signal lines 76 are arranged in a lattice form on a glass substrate 1, and a TFT 80 and a pixel electrode 7 are provided for each area where a scanning line 72 and a signal line 76 cross.

Here, the structures of the top-gate TFT 80 and the bottom-gate TFT 10 (see FIGS. 2 and 3) are vertically inverted with respect to the glass substrate 1. In other words, in the TFT 80, the glass substrate 1 is first provided with a source electrode 81 and a drain electrode 83. Then, on top of the source and drain electrodes 81 and 83 are provided a contact layer (not shown), a semiconductor domain 84 (semiconductor layer), a gate insulating film 74 (insulating film), and a gate electrode 75, in that order.

Next an inter-layer insulating film 9 (insulating layer) is provided so as to cover the TFT 80, the gate insulating film 74, etc. The inter-layer insulating film 9 can be made of a film of a photosensitive resin material such as acrylic or an inorganic material such as $SiN_x$, or of a laminated film of two or more such materials.

The gate electrode 75 is connected to a scanning line 72 which is provided on the inter-layer insulating film 9 via a contact hole 72a. The source electrode 81 is connected to a signal line 76 formed on the same layer therewith. Further, the drain electrode 83 is connected to a pixel electrode 7 formed on the inter-layer insulating film 9 via a contact hole 83b formed in the gate insulating film 74, a drain line 83a provided between the gate insulating film 74 and the inter-layer insulating film 9, and a contact hole 7a formed in the inter-layer insulating film 9.

Further, below the contact hole 7a and between the glass substrate 1 and the gate insulating film 74 is provided an auxiliary capacitance line 73, which forms an auxiliary capacitance 82 (see FIG. 24) with the drain line 83a.

In the foregoing structure, the glass substrate i is provided with a layer which forms the signal lines 76; a layer provided above the layer forming the signal lines 76, which forms the gate electrodes 75; and a layer provided above the layer forming the gate electrodes 75, which forms the scanning lines 72. Further, the gate insulating film 74 is provided between the layer forming the signal lines 76 and the layer forming the gate electrodes 75, and the inter-layer insulating film 9 is provided between the layer forming the gate electrodes 75 and the layer forming the scanning lines 72.

Furthermore, in the foregoing structure, it is possible to form the signal lines 76, the source and drain electrodes 81 and 83, and the auxiliary capacitance lines 73 from the same layer. In the same way, it is possible to form the gate electrodes 75 and the drain lines 83a from the same layer, and to form the pixel electrodes 7 and the scanning lines 72 from the same layer.

Incidentally, the materials for the foregoing structural elements are the same as those in the first embodiment, etc., and the manufacturing method of the first embodiment can be applied to the present embodiment by changing the order of manufacturing steps as necessary, and accordingly explanation thereof will be omitted here.

In conventional active matrix substrates, including those provided with top-gate TFTS, the scanning lines and signal lines were separated chiefly by the gate insulating film alone. With such a structure, the thickness of the gate insulating film was determined in accordance with the specifications of the TFT, and since the electrostatic capacitance value of the gate insulating film is based on the thickness of this film, it was difficult to set a smaller value. For this reason, in areas where a signal line and a scanning line are opposite one another on opposite sides of the gate insulating film, the capacitance value of a signal line capacitance arising between the signal line and the scanning line is increased.

In the foregoing structure, however, the scanning lines 72 and the signal lines 76 are separated by the inter-layer insulating film 9, which is provided between the layer forming the gate electrodes 75 and the layer forming the scanning lines 72. Consequently, the interval between the signal lines 76 and the scanning lines 72 separated by the inter-layer insulating film 9 can be set to a greater value than the thickness of the gate insulating film 74. Thus the capacitance value of the signal line capacitance arising between the signal lines 76 and the scanning lines 72 can be reduced in comparison with the foregoing conventional structure.

Since the inter-layer insulating film 9 is provided between the layer forming the gate electrodes 75 and the layer forming the signal lines 76, it is independent of the specifications of the TFTs 80, unlike the gate insulating film 74. Accordingly, the inter-layer insulating film 9 can be formed in such a way that the signal line capacitance value is sufficiently reduced.

Incidentally, the active matrix substrate according to the present embodiment may be structured so as to further include a protective film (second protective film; scanning line protective film) corresponding to the signal line protective film 8a, which protects the scanning line 72 exposed on the extreme surface of the active matrix substrate (see FIGS. 13 and 14).

In addition, the active matrix substrate according to the present embodiment can be used in a flat-panel image sensor substantially equivalent to the flat-panel image sensors explained in the fourth and fifth embodiments with reference to FIGS. 18 and 19, respectively. Further, a flat-panel image sensor incorporating the active matrix substrate according to the present embodiment can obtain effects substantially equivalent to those of the flat-panel image sensors of the fourth and fifth embodiments above.

As discussed above, in the active matrix substrate according to the present embodiment, the glass substrate 1 is provided with a layer (first electrode layer) which forms the signal lines 76 (the source electrodes 81), a layer (and second electrode layer) which forms the gate electrodes 75, and a layer which forms the scanning lines 72, in that order; in which an insulating layer (inter-layer insulating film 9) is provided between the layer forming the gate electrodes 75 and the layer forming the scanning lines 72. The signal line 76 (first lines) and the scanning lines 72 (second lines) are separated by the insulating layer.

In this structure, the signal lines 76 and the scanning lines 72 are provided on opposite sides of the insulating layer from each other, extending, for example, in intersecting directions. Consequently, the insulating layer can reduce the capacitance value of the signal line capacitance. Accordingly, the signal line capacitance value can be sufficiently reduced.

As a result, with this structure, it is possible to provide an active matrix substrate in which functions of the TFTs 80 are good, and the signal line capacitance arising between the signal lines 76 and the scanning lines 72 has a small capacitance value.

Further, the pixel electrodes 7 connected to the drain electrodes 83 are preferably made from the same layer as that of the scanning lines 72.

In this structure, the pixel electrodes 7 connected to the drain electrodes 83 are made from the same layer as that of the scanning lines 72. Accordingly, even in the foregoing structure, in which the scanning lines 72 and the gate electrodes 75 are formed on different layers, great increase of the number of manufacturing steps can be avoided because the scanning lines 72 and the pixel electrodes 7 are made from the same layer.

As a result, the foregoing active matrix substrate can be manufactures with fewer manufacturing steps, thus contributing to improvement of yield and reduction of costs.

Eighth Embodiment

The following eighth embodiment will explain, with reference to FIGS. 25 through 28, a structure in which the active matrix substrate of the seventh embodiment above is further provided with a protective film 78 (insulating layer). Members having the same functions as those shown in the drawings pertaining to the first through seventh embodiments above will be given the same reference symbols, and explanation thereof will be omitted here.

Figure 25:
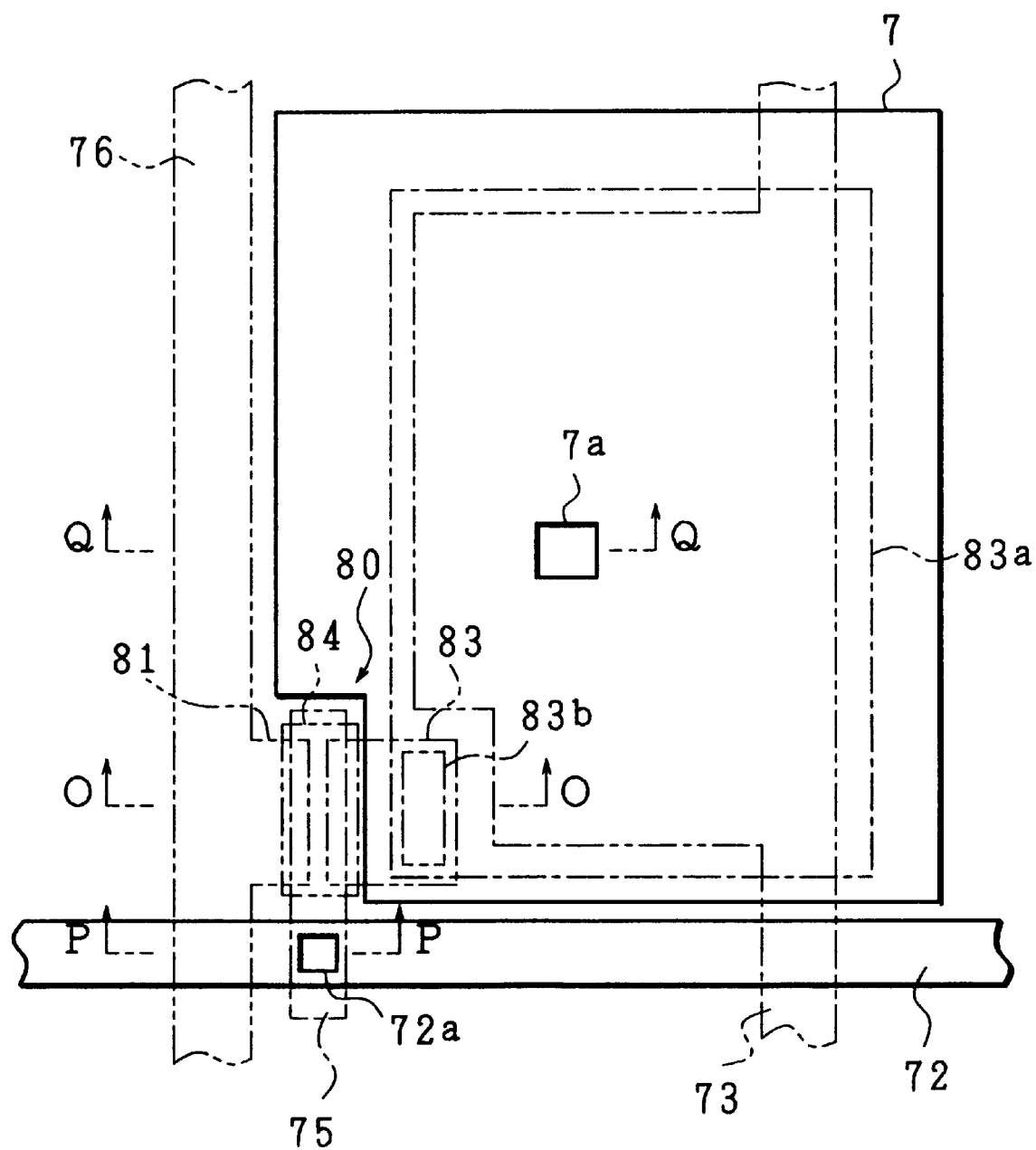
FIG. 25 is a plan view of an active matrix substrate according to an eighth embodiment of the present invention.
Figure 26:
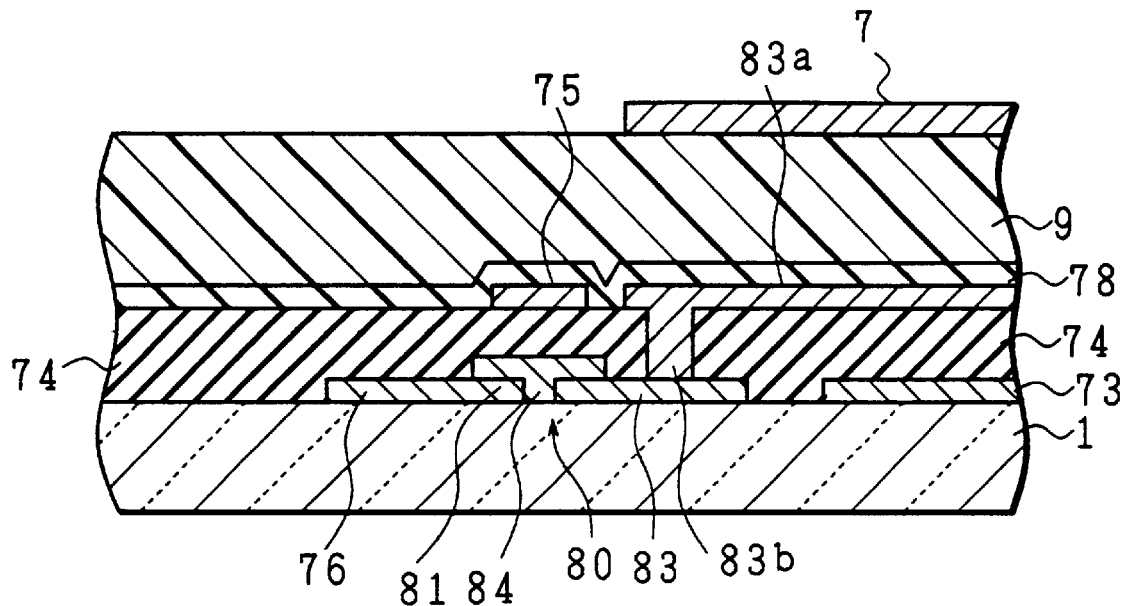
FIG. 26 is a cross-sectional view taken at line O—O of FIG. 25.
Figure 27:
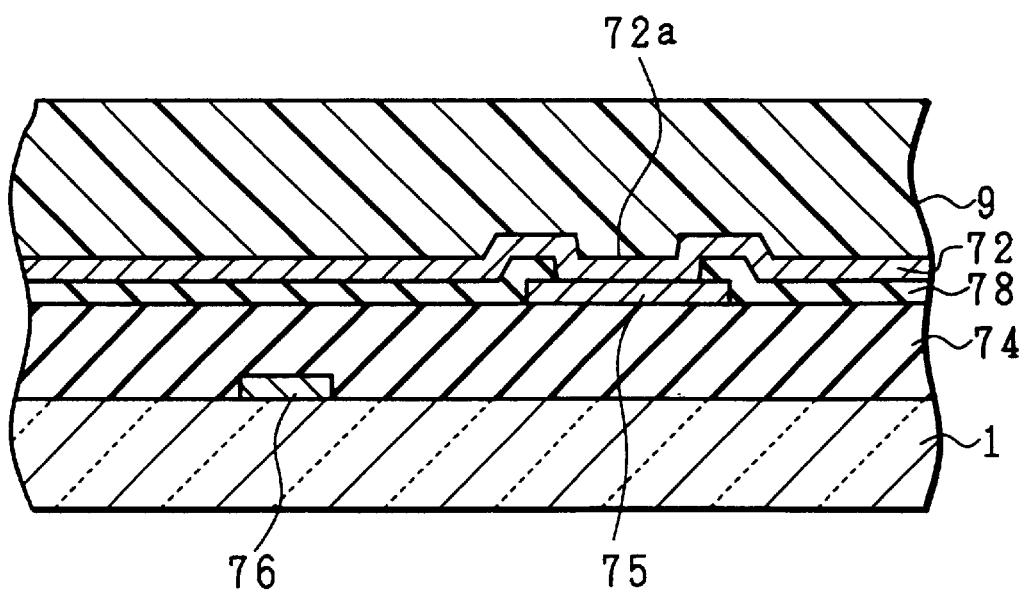
FIG. 27 is a cross-sectional view taken at line P—P of FIG. 25.
Figure 28:
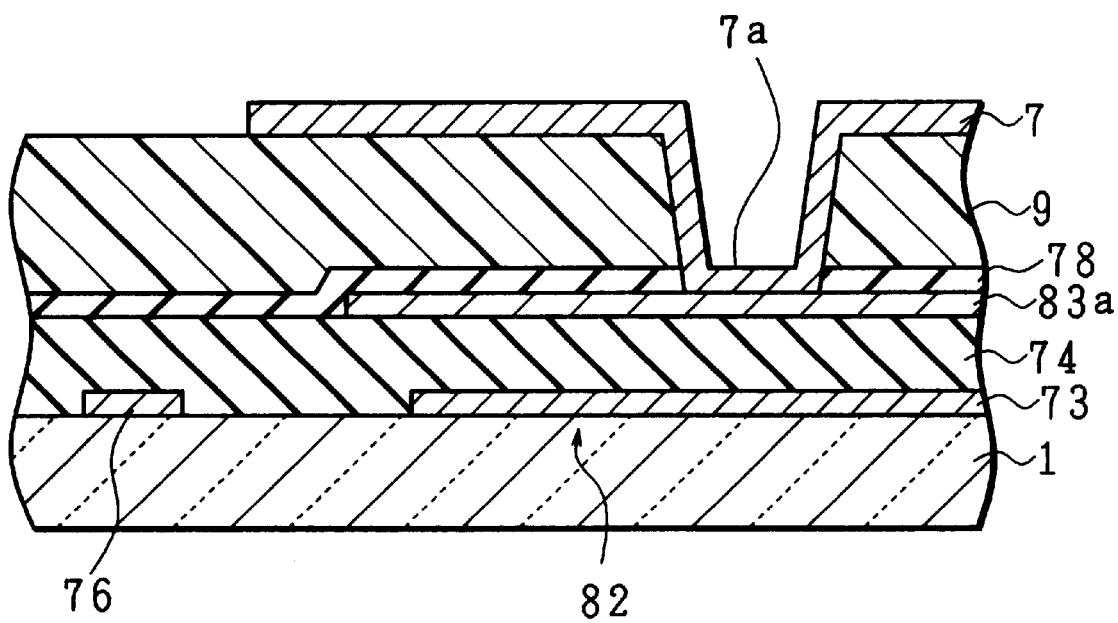
FIG. 28 is a cross-sectional view taken at line Q—Q of FIG. 25.

FIG. 25 is a plan view of an active matrix substrate according to the present embodiment, and FIGS. 26, 27, and 28 are cross-sectional views taken at lines O—O, P—P, and Q—Q, respectively, of FIG. 25.

The active matrix substrate according to the present embodiment is structured as that of the seventh embodiment above, except that the insulating layer between the layer forming the gate electrode 75 and the drain line 83a on one hand and the layer forming the pixel electrode 7 on the other hand is made up of two layers: a protective film 78 (see FIGS. 26–28) and the inter-layer insulating film 9. Further, the scanning lines 72 are provided between the protective film 78 and the inter-layer insulating film 9.

In addition to the effect of reducing electrostatic capacitance value, the present active matrix substrate, like that of the third embodiment above, has the structural advantage of small incidence of height difference (unevenness) in the surface of the active matrix substrate (surface unevenness), or a small height difference value.

Accordingly, the structure of the present active matrix substrate is suited to a flat-panel image sensor. Further, by using the present active matrix substrate in a flat-panel image sensor, crystallization of the photoelectric conversion layer of e.g. a-Se can be suppressed, thereby preventing impairment of the characteristics of the photoelectric conversion layer.

In the active matrix substrate according to the present embodiment, like that of the third embodiment above, the scanning lines 72 and the pixel electrodes 7 are separated by the inter-layer insulating film 9, and accordingly the pixel electrodes 7 may be allowed to overlap with the scanning lines 72. In this way, the surface area of each pixel electrode 7 can be increased, thus increasing the aperture ratio.

Incidentally, the active matrix substrate according to the present embodiment can be used in a flat-panel image sensor substantially equivalent to the flat-panel image sensor explained in the sixth embodiment with reference to FIG. 20. Further, a flat-panel image sensor incorporating the active matrix substrate according to the present embodiment can obtain effects substantially equivalent to those of the flat-panel image sensor of the sixth embodiment above.

As discussed above, in the active matrix substrate according to the present embodiment, it is preferable if the insulating layer is made of the protective film 78 which protects the TFT 80, and if the inter-layer insulating film 9 is provided so as to cover the scanning lines 72 and the protective film 78.

With this structure, the scanning lines 72 and the signal lines 76 are separated by the protective film 78 as insulating layer. In this case, the thickness of the protective film 78 can be increased, and the signal line capacitance value reduced, without impairing the functions of the TFT 80.

Further, with the foregoing structure, a height difference between the protective film 78 and the scanning lines 72 provided thereon, and height differences due to the TFT 80 can be evened and smoothed by the inter-layer insulating film 9. As a result, when manufacturing a flat-panel image sensor by providing a photoelectric conversion layer made of e.g. a-Se on the present active matrix substrate, the a-Se can be prevented from crystallizing due to surface unevenness attributable to the scanning lines 72, the TFT 80, etc., thus preventing impairment of the performance of the photoelectric conversion layer.

Further, the pixel electrodes 7 connected to the drain electrodes 83 are preferably provided on the inter-layer insulating film 9.

In this structure, the scanning lines 72 and the pixel electrodes 7 are separated by the inter-layer insulating film 9. Accordingly, the pixel electrodes 7 may overlap with the scanning lines 72, and thus the aperture ratio can be increased by increasing the surface area of each pixel electrode 7.

The embodiments and concrete examples of implementation discussed in the foregoing detailed explanation serve solely to illustrate the technical details of the present invention, which should not be narrowly interpreted within the limits of such. embodiments and concrete examples, but rather may be applied in many variations, provided such variations do not depart from the spirit of the present invention or exceed the scope of the patent claims set forth below.

What is claimed is:

1. An active matrix substrate comprising:
   a substrate;
   a switching element including a gate electrode, a source electrode, and a drain electrode, and switching between the source and drain electrodes based on a signal supplied to the gate electrode;
   a scanning line connected to the gate electrode;
   a signal line connected to the source electrode; and
   a pixel electrode connected to the drain electrode;
   said substrate being provided with a layer which forms said scanning line; a layer, provided above said layer forming the scanning line, which forms the source electrode; a layer, provided above said layer forming the source electrode, which forms said signal line; and an insulating layer, provided between said layer forming the source electrode and said layer forming the signal line; and
   said scanning line and said signal line being separated from each other by said insulating layer.

2. The active matrix substrate set forth in claim 1, wherein:
   said layer forming the scanning line also forms the gate electrode;
   the drain electrode is made from said layer forming the source electrode; and
   said switching element includes a semiconductor layer provided between the gate electrode on the one hand and the source and drain electrodes on the other hand, in contact with the source and drain electrodes.

3. The active matrix substrate set forth in claim 2, further comprising a source line formed by a part of said layer forming the source electrodes which extends outside a domain on the semiconductor layer; and a contact hole formed in said insulating layer in a position on the semiconductor layer;
   wherein said signal line is connected to said source line via said contact hole.

4. The active matrix substrate set forth in claim 2, further comprising a first insulating film, provided between the semiconductor layer and said layer forming the scanning line and the gate electrode;
   wherein said scanning line and said signal line are also separated from each other by said first insulating film.

5. The active matrix substrate set forth in claim 2, further comprising:
   an auxiliary capacitance formed between said insulating layer and said substrate by two electrodes, which is connected to the drain electrode; and
   an auxiliary capacitance line forming one of the electrodes of said auxiliary capacitance, separated from said signal line by said insulating layer.

6. The active matrix substrate set forth in claim 5, wherein said auxiliary capacitance line is made from said layer forming the scanning line.

7. The active matrix substrate set forth in claim 5, wherein:
   said auxiliary capacitance line is provided extending in a direction intersecting with a direction in which said signal line extends; and
   said auxiliary capacitance line has a width which is relatively smaller in an area where said auxiliary capacitance line crosses under said signal line, and relatively greater elsewhere.

8. The active matrix substrate set forth in claim 5, wherein the other electrode of said auxiliary capacitance is formed by an extension of said layer forming the drain electrode.

9. The active matrix substrate set forth in claim 5, further comprising a second insulating film, provided between said layer forming the drain electrode and a layer forming the auxiliary capacitance line;
   wherein said auxiliary capacitance line and said signal line are also separated from each other by said second insulating film.

10. The active matrix substrate set forth in claim 4, further comprising a drain line formed by an extension of said layer forming the drain electrode;
    wherein said drain line is provided above an adjacent scanning line adjacent to said scanning line; and
    said drain line is separated from said adjacent scanning line by said first insulating film.

11. The active matrix substrate set forth in claim 1, wherein said pixel electrode connected to the drain electrode is made from said layer forming the signal line.

12. The active matrix substrate set forth in claim 11, wherein said pixel electrode is connected to the drain electrode via a contact hole formed in said insulating layer.

13. The active matrix substrate set forth in claim 1, further comprising a signal line protective film covering said signal line.

14. The active matrix substrate set forth in claim 1, wherein said insulating layer includes an inter-layer insulating film made of a resin material.

15. The active matrix substrate set forth in claim 14, wherein said insulating layer further includes a protective film which protects said switching element.

16. The active matrix substrate set forth in claim 14, wherein said inter-layer insulating film is made of a resin material having photosensitivity.

17. The active matrix substrate set forth in claim 14, wherein said inter-layer insulating film is made of acrylic resin.

18. The active matrix substrate set forth in claim 1, wherein:
   said insulating layer is made from a protective film which protects said switching element; and
   the active matrix substrate further comprises an inter-layer insulating film which covers said signal line and said protective film.

19. The active matrix substrate set forth in claim 18, wherein said pixel electrode connected to the drain electrode is provided on said inter-layer insulating film.

20. The active matrix substrate set forth in claim 18, wherein said inter-layer insulating film is made of a resin material.

21. The active matrix substrate set forth in claim 13, wherein said signal line protective film is made of acrylic resin.

22. The active matrix substrate set forth in claim 13, wherein said signal line protective film has a thickness of 1 $\mu$m through 3 $\mu$m.

23. The active matrix substrate set forth in claim 13, wherein said signal line protective film is an oxidation film of said signal line.

24. The active matrix substrate set forth in claim 19, wherein said pixel electrode is provided so as to overlap with said signal line, but is separated therefrom by said inter-layer insulating film.

* * * * *